(12) United States Patent
Schulte et al.

(10) Patent No.: US 11,764,326 B2
(45) Date of Patent: Sep. 19, 2023

(54) METAMORPHIC TWO-JUNCTION PHOTOVOLTAIC DEVICES WITH REMOVABLE GRADED BUFFERS

(71) Applicants: Alliance for Sustainable Energy, LLC, Golden, CO (US); MASSACHUSETTS INSTITUTE OF TECHNOLOGY, Cambridge, MA (US)

(72) Inventors: Kevin Louis Schulte, Denver, CO (US); Myles Aaron Steiner, Denver, CO (US); Daniel Joseph Friedman, Lakewood, CO (US); Ryan Matthew France, Golden, CO (US); Asegun Henry, Boston, MA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/460,829

(22) Filed: Aug. 30, 2021

(65) Prior Publication Data
US 2022/0069157 A1    Mar. 3, 2022

Related U.S. Application Data

(60) Provisional application No. 63/071,485, filed on Aug. 28, 2020.

(51) Int. Cl.
*H01L 31/18* (2006.01)
*H01L 31/0687* (2012.01)

(52) U.S. Cl.
CPC .... *H01L 31/1844* (2013.01); *H01L 31/06875* (2013.01); *H01L 31/1892* (2013.01)

(58) Field of Classification Search
CPC .......... H01L 31/1844; H01L 31/06875; H01L 31/1892
See application file for complete search history.

(56) References Cited

U.S. PATENT DOCUMENTS

| 8,187,907 | B1 | 5/2012 | Newman |
| 2003/0156610 | A1 | 8/2003 | Kwon |
| 2006/0054900 | A1* | 3/2006 | Takamoto ........... H01L 21/0237 |
| | | | 257/E21.127 |
| 2007/0137698 | A1* | 6/2007 | Wanlass ................ H01L 31/042 |
| | | | 136/262 |

(Continued)

OTHER PUBLICATIONS

Huang, et al., Solar Energy Materials and Solar Cells 208 (2020) 110398 (Year: 2020).*

(Continued)

*Primary Examiner* — Sadie White
(74) *Attorney, Agent, or Firm* — Michael A. McIntyre

(57) ABSTRACT

The present disclosure relates to a method for manufacturing a device, where the device includes, in order, a metamorphic contact layer, a first metamorphic junction, a metamorphic tunnel junction, and a second metamorphic junction. To produce the device, the manufacturing includes, in order, a first depositing of a buffer layer onto a substrate, a second depositing of the metamorphic contact layer, a third depositing of the first metamorphic junction, a fourth depositing of the metamorphic tunnel junction, a fifth depositing of the second metamorphic junction, and the removing of the buffer layer and the substrate.

19 Claims, 22 Drawing Sheets

(56) References Cited

U.S. PATENT DOCUMENTS

| | | | | |
|---|---|---|---|---|
| 2016/0380142 | A1* | 12/2016 | Guter | H01L 31/03046 |
| | | | | 136/255 |
| 2017/0141256 | A1* | 5/2017 | Kayes | H01L 31/06875 |
| 2018/0240922 | A1* | 8/2018 | Derkacs | H01L 31/1852 |
| 2019/0245109 | A1* | 8/2019 | Steiner | H01L 31/1892 |
| 2020/0119216 | A1* | 4/2020 | Jain | H01L 31/0547 |

OTHER PUBLICATIONS

Geisz, et al., Applied Physics Letters, 91, 023502, 2007 (Year: 2007).*

Schulte, et al., IEEE Journal of Photovoltaics, vol. 7, No. 1, Jan. 2017, pp. 347-353 (Year: 2017).*

Kwon, et al., IEEE Electron Device Letters, vol. 24, No. 10, 2003 (Year: 2003).*

Amy, C. et al., "Thermal energy grid storage using multi-junction photovoltaics," RSC Energy & Environmental Science, vol. 12, 2019, 10 pages.

Burger, T. et al., "Thin-Film Architectures with High Spectral Selectivity for Thermophotovoltaic Cells," ACS Photonics, vol. 5, 2018, 7 pages.

Caneau, C. et al., "OMVPE Grown GaInAs:C for HBTs," Journal of Electronic Materials, vol. 25, No. 3, 1996, 5 pages.

France, R. et al., "Design Flexibility of Ultrahigh Efficiency Four-Junction Inverted Metamorphic Solar Cells," EEE Journal of Photovoltaics, vol. 6, No. 2, Mar. 2016, 6 pages.

France, R. et al., "Development of Lattice-Mismatched GaInAsP for Radiation Hardness," IEEE Journal of Photovoltaics, vol. 10, No. 1, Jan. 2020, 6 pages.

Garcia, I. et al., "Metamorphic Ga0.76In0.24As/GaAs0.75Sb0.25 tunnel junctions grown on GaAs substrates," Journal of Applied Physics, vol. 116, 2014, 6 pages.

Geisz, J.F. et al., "In situ stress measurement for MOVPE growth of high efficiency lattice-mismatched solar cells," Journal of Crystal Growth, vol. 310, 2008, 6 pages.

Geisz, J.F. et al., "Generalized Optoelectronic Model of Series-Connected Multijunction Solar Cells," EEE Journal of Photovoltaics, vol. 5, No. 6, Nov. 2015, 13 pages.

Geisz, J.F. et al., "Building a Six-Junction Inverted Metamorphic Concentrator Solar Cell," IEEE Journal of Photovoltaics, vol. 8, No. 2, Mar. 2018, 7 pages.

Geisz, J.F. et al., "Six-junction III-V solar cells with 47.1% conversion efficiency under 143 Suns concentration," Nature Energy, vol. 5, Apr. 2020, 13 pages.

Goorsky, M.S. et al., "Characterization of epitaxial GaAs and $Al_xGa_{1-x}As$ layers doped with oxygen," Applied Physics Letters, vol. 58, No. 18, May 1991, 3 pages.

Guter, W. et al., "Space Solar Cells—3G30 and Next Generation Radiation Hard Products," E3S Web of Conferences 16, 2017, 6 pages.

Heckelmann, S. et al., "Investigations on $Al_xGa_{1-x}As$ Solar Cells Grown by MOVPE," IEEE Journal of Photovoltaics, vol. 5, No. 1, Jan. 2015, 8 pages.

Heckelmann, S. et al., "Material quality frontiers of MOVPE grown AlGaAs for minority carrier devices," Journal of Crystal Growth, vol. 464, 2017, 5 pages.

Kondo, T. et al., "Temperature Characteristics of 1.16 μm Highly Strainted GaInAs/GaAs VCSELs," Proceedings of SPIE, vol. 4649, 2002, 11 pages.

Leite, M. et al., "Wide-band-gap InAlAs solar cell for an alternative multijunction approach," Applied Physics Letters, vol. 98, 2011, 3 pages.

Liu, X.Q. et al., Organometallic vapor phase epitaxy growth of upright metamorphic multijunction solar cells, Journal of Crystal Growth, vol. 352, 2012,, 4 pages.

Mathews, I. et al., "InAlAs solar cell on a GaAs substrate emmploying a graded $In_xGa_{1-x}As$-InP metamorphic buffer layer," Applied Physics Letters, vol. 102, 2013, 4 pages.

Olmon, R. et al., "Optical dielectric function of gold," Physical Review B, vol. 86, 2012, 9 pages.

Osterwald, C.R. et al., "Concentrator Cell Efficiency Measurement Errors Caused by Unfiltered Xenon Flash Solar Simulators," 10th International Conference on Concentrator Photovoltaic Systems, AIP Conference Proceedings 1616, 2014, 5 pages.

Schulte, K. et al., "Internal Resistive Barriers Related to Zinc Diffusion During the Growth of Inverted Metamorphic Multijunction Solar Cells," IEEE Journal of Photovoltaics, vol. 9, No. 1, Jan. 2019, 7 pages.

Schulte, K. et al., "Guided Optimization of Phase-Unstable III-V Compositionally Graded Buffers by Cathodoluminescence Spectrum Imaging," IEEE Journal of Photovoltaics, vol. 10, No. 1, Jan. 2020, 8 pages.

Smith, B. et al., "InAlAs photovoltaic cell design for high device efficiency," Progress in Photovoltaics Research and Applications, vol. 25, 2017, 8 pages.

Steiner, M. et al., "A Direct Comparison of Inverted and Non-inverted Growths of GaInP Solar Cells," Presentation at the 33rd IEEE PVSC Conference held May 11-16, 2008, 14 pages.

Stockman, S.A. et al., "Passivation of Carbon Acceptors during Growth of Carbon-Doped GaAs, InGaAs, and HBTs by MOCVD," Journal of Electronic Materials, vol. 21, No. 12, 1992, 8 pages.

Yu, K.M. et al., "Nitrogen-induced increase of the maximum electron concentration in group III-N-V alloys," Physical Review B, vol. 61, No. 20, May 15, 2000, 4 pages.

* cited by examiner

| $Al_{0.14}Ga_{0.56}In_{0.30}As$ 1.2 eV | $Al_{0.14}Ga_{0.56}In_{0.30}As$ 1.2 eV | $Al_{0.14}Ga_{0.56}In_{0.30}As$ 1.2 eV |
| --- | --- | --- |
| $GaAs_{0.73}Sb_{0.27}{:}C$ 0.98 eV | $GaAs_{0.73}Sb_{0.27}{:}C$ 0.98 eV | $Al_{0.30}Ga_{0.41}In_{0.29}As{:}C$ 1.43 eV |
| $Ga_{0.7}In_{0.3}As{:}Se$ 1.0 eV | $Ga_{0.22}In_{0.78}P{:}Se$ 1.53 eV | $Al_{0.30}Ga_{0.41}In_{0.29}As{:}Se$ 1.43 eV |
| $Ga_{0.7}In_{0.3}As$ 1.0 eV | $Ga_{0.7}In_{0.3}As$ 1.0 eV | $Ga_{0.7}In_{0.3}As$ 1.0 eV |
| Structure 1 | Structure 2 | Structure 3 |

Figure 6A

METAMORPHIC TWO-JUNCTION PHOTOVOLTAIC DEVICES WITH REMOVABLE GRADED BUFFERS

CROSS-REFERENCE TO RELATED APPLICATIONS

This application claims priority from U.S. Provisional Patent Application No. 63/071,485 filed on Aug. 28, 2019, the contents of which are incorporated herein by reference in its entirety.

CONTRACTUAL ORIGIN

This invention was made with government support under Contract Nos. DE-AC36-08GO28308 and DE-AR0001005 awarded by the Department of Energy. The government has certain rights in the invention.

SUMMARY

An aspect of the present disclosure is a method for manufacturing a device, where the device includes, in order, a metamorphic contact layer, a first metamorphic junction, a metamorphic tunnel junction, and a second metamorphic junction. To produce the device, the manufacturing includes, in order, a first depositing of a buffer layer onto a substrate, a second depositing of the metamorphic contact layer, a third depositing of the first metamorphic junction, a fourth depositing of the metamorphic tunnel junction, a fifth depositing of the second metamorphic junction, and the removing of the buffer layer and the substrate. In some embodiments of the present disclosure, the buffer layer may include a continuous graded buffer layer and/or a plurality of step-graded buffer layers.

In some embodiments of the present disclosure, the method may further include, between the first depositing and the second depositing, the depositing of a sacrificial layer capable of degradation in the presence of a chemical etchant. In some embodiments of the present disclosure, the sacrificial layer may include AlInP. In some embodiments of the present disclosure, the removing may include applying the chemical etchant to the sacrificial layer. In some embodiments of the present disclosure, the chemical etchant may include an acid. In some embodiments of the present disclosure, the acid may include hydrochloric acid. In some embodiments of the present disclosure, the method may further include a first intermediate depositing of a strain overshoot layer having a 1 µm thickness, performed after the first depositing and before the second depositing.

In some embodiments of the present disclosure, the method may further include a second intermediate depositing of a step-back layer lattice-matched to the in-plane lattice constant of the overshoot layer and having a 1 µm thickness, performed after the first intermediate depositing and before the second depositing. In some embodiments of the present disclosure, the strain overshoot layer may include $Ga_{(1-z)}In_zP$, where $0.5 \leq z \leq 0.8$. In some embodiments of the present disclosure, the step-back layer may include an alloy made of at least one two of gallium, indium, aluminum, arsenic, antimony, nitrogen, and/or phosphorous. In some embodiments of the present disclosure, the metamorphic contact layer may include at least three of gallium, indium, aluminum, arsenic, and/or phosphorous. In some embodiments of the present disclosure, the metamorphic contact layer may include $Ga_{(1-x)}In_xAs$, where $0.6 \leq x \leq 0.8$.

In some embodiments of the present disclosure, the metamorphic contact layer may include an alloy of about $Ga_{0.31}In_{0.69}As$. In some embodiments of the present disclosure, the metamorphic contact layer may further include nitrogen. In some embodiments of the present disclosure, the metamorphic contact layer may be doped with selenium. In some embodiments of the present disclosure, the metamorphic contact layer may have a thickness between about 0.05 µm and about 0.50 µm. In some embodiments of the present disclosure, the second depositing may include a first growing step and a second growing step, where the first growing step is performed at a temperature between about 400° C. and about 800° C., and the second growing step is performed at a temperature between about 600° C. and about 800° C.

In some embodiments of the present disclosure, the first growing may produce a highly-Se-doped first layer having between about 1e18 and about 1e20 Se atoms per cubic centimeter and a thickness between about 0.1 µm and about 1.0 µm, where the Se is provided by an $H_2Se$ gas. In some embodiments of the present disclosure, the second growing may produce a lower-Se-doped second layer having between about 1e17 and about 1e19 Se atoms per cubic centimeter and a thickness between greater than zero µm and about 1.0 µm, where the Se is provided by an $H_2Se$ gas.

BRIEF DESCRIPTION OF DRAWINGS

FIG. 6A illustrates metamorphic tunnel junction structures, according to some embodiments of the present disclosure.

REFERENCE NUMERALS

Figure 1:
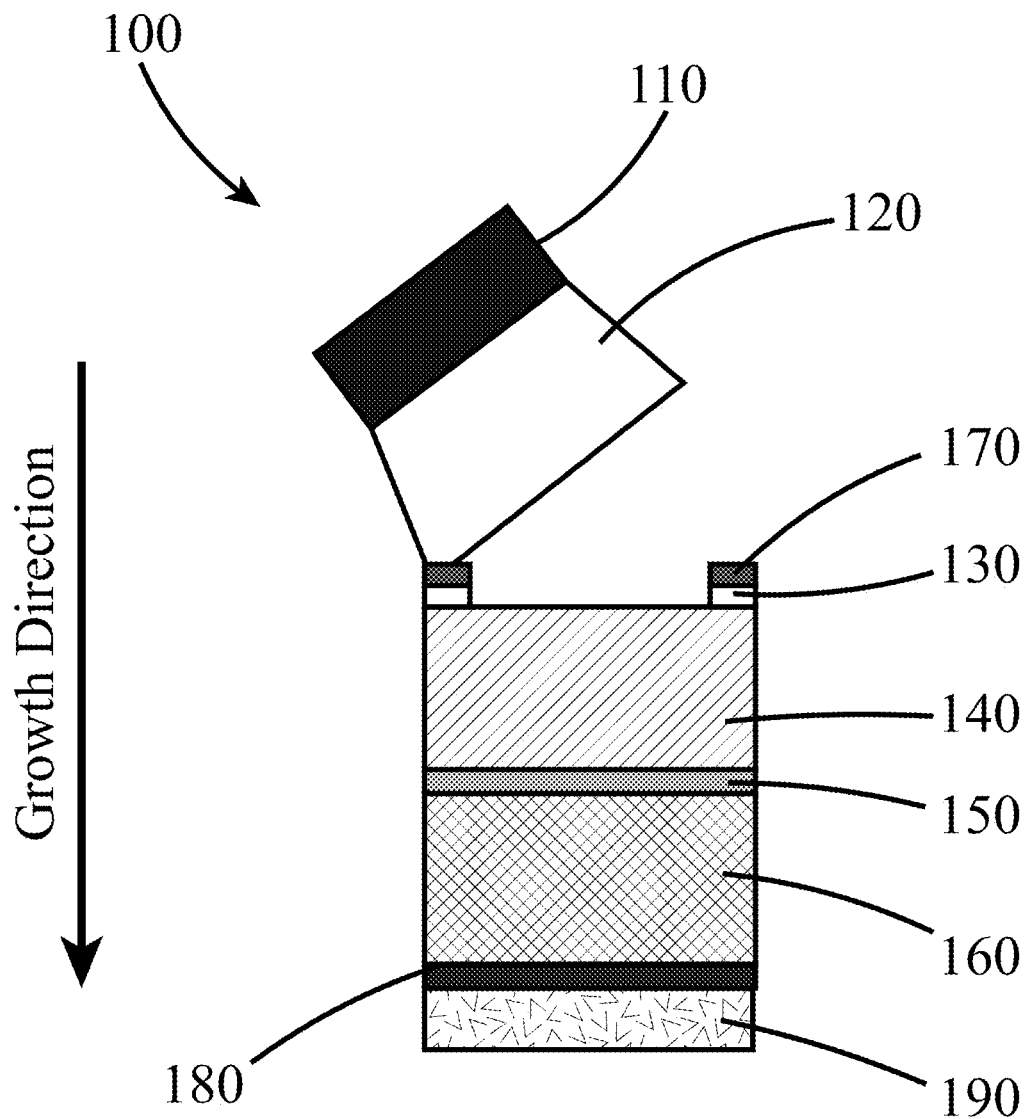
FIG. 1 illustrates a device, according to some embodiments of the present disclosure.

100 . . . device
110 . . . substrate
120 . . . structure that includes buffer layers
130 . . . metamorphic contact layer
140 . . . first metamorphic junction
150 . . . metamorphic tunnel junction
160 . . . second metamorphic junction
170 . . . first contact
180 . . . second contact
190 . . . handle
200 . . . method
210 . . . first depositing of structure that includes buffer layers
220 . . . second depositing of metamorphic contact layer
230 . . . third depositing of first metamorphic junction
240 . . . fourth depositing of tunnel junction
250 . . . fifth depositing of second metamorphic junction
260 . . . removing of substrate and structure

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to +1%, ±0.9%, ±0.8%, ±0.7%, ±0.6%, ±0.5%, ±0.4%, ±0.3%, ±0.2%, or +0.1% of a specific numeric value or target.

The present disclosure relates to inverted metamorphic multijunction (IMM) photovoltaic (PV) devices constructed of lattice-mismatched junctions designed for high-temperature thermophotovoltaic (TPV) applications. The present disclosure also relates to unique methods for making such IMM PV devices for TPV applications. As shown herein, these TPV devices differ from incumbent IMM solar cell devices in that the devices described herein utilize multiple junctions grown at a single lattice constant, which differs from the lattice constant of the substrate. Among other things, the resultant architecture enables removal of a compositionally graded buffer used in the manufacturing process, which would otherwise filter light from the absorbing junctions and absorb sub-bandgap light via free-carrier absorption and absorption by dislocation defects. Sub-bandgap absorption dramatically reduces the efficiency of TPV systems that use high reflectivity cells to enable band-edge spectrum filtering. Thus, the devices and methods described herein provide significant improvements over incumbent technologies. As used herein the terms "metamorphic" and "lattice-mismatched" are used interchangeably to mean a material having a different lattice constant than that of the substrate.

As described herein, in some embodiments of the present disclosure, a TPV device may include four important components: 1) a metamorphic contact layer, 2) a lattice-mismatched AlGaInAs top junction, 3) a transparent tunnel junction, and 4) a lattice-mismatched bottom 1.0 eV GaInAs junction. As shown herein, methods that maximize AlGaInAs cell quality are achieved by, among other things, selecting growth conditions that minimize oxygen defect incorporation, resulting in a device with a one-sun bandgap-open circuit voltage offset of 0.41 V under an AM1.5D spectrum at 22 mA/cm². In some embodiments of the present disclosure, a mismatched GaInAs:Se (GaInAs doped with Se at about 1×10¹⁹ per cm³) layer is utilized as a low resistance contact layer. In addition, a GaAsSb:C (GaAsSb doped with carbon at about 5×10¹⁹ per cm³)/GaInP:Se (GaInP doped with Se at about 5×10¹⁹ per cm³) tunnel junction is described herein, which is suitable for high-power densities and is more transparent than incumbent tunnel junction compositions. A tandem TPV device is also characterized and described herein, with testing including subjecting it to a high-intensity spectrum designed to approximate the emission from a 2150° C. radiator. The results allowed the estimation of various performance metrics, including a projected TPV efficiency of 39.9% at ~30% of the blackbody irradiance, and 36% under full 118 W/cm² irradiance. In some embodiments of the present disclosure, such a tandem device may include a first metamorphic junction constructed of $Al_{0.14}Ga_{0.57}In_{0.29}As$ and having a bandgap of about 1.2 eV and a second metamorphic junction $Ga_{0.70}In_{0.30}As$ and having a bandgap of about 1.0 eV.

Figure 2:
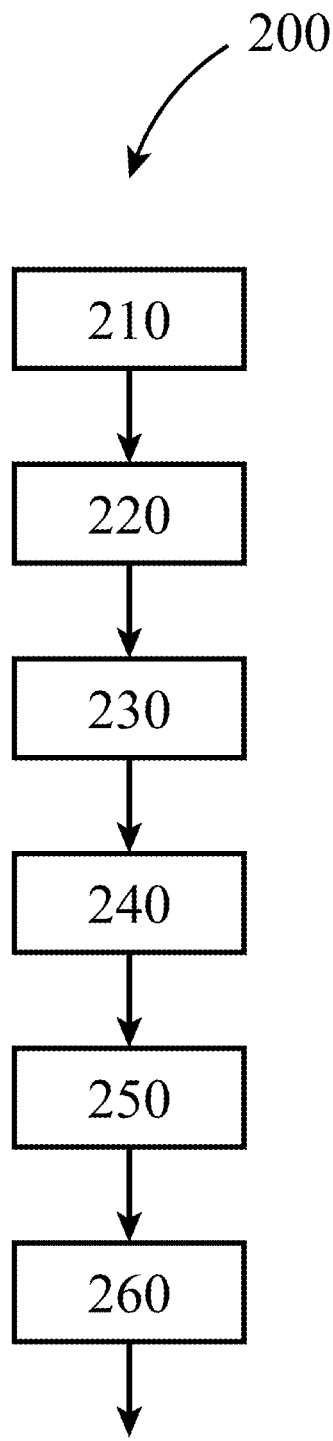
FIG. 2 illustrates a method for manufacturing a device like that shown in FIG. 1, according to some embodiments of the present disclosure.

FIG. 1 illustrates a device 100, according to some embodiments of the present disclosure, and FIG. 2 illustrates a method 200 for manufacturing such a device 100. FIG. 1 illustrates that a device 100, for example a TPV device, may include, in order, a metamorphic contact layer 130, a first (top, high bandgap) metamorphic junction 140, a metamorphic tunnel junction 150, and a second (bottom, low bandgap) metamorphic junction 160. FIG. 1 also illustrates that a device 100 may temporarily include, e.g. during the manufacturing process, a structure 120 made up of a plurality of buffer layers positioned on a substrate 110. As described in more detail, the substrate 110 and the structure 120 may advantageously be removed from the device 100 leading to, among other things, a better performing TPV device. In some embodiments of the present disclosure, at least one of the substrate 110 and/or the structure 120 may be reused. Referring again to FIG. 1, a device 100 may also include at least one of a second contact 180 and/or a handle 190. In addition, a device 100 may include at least one first contact 170, positioned for example, on a contact layer 130.

In some embodiments of the present disclosure, a metamorphic contact layer may be constructed of an alloy that includes at least one of GaInAs, GaAsSb, GaInAsN, AlGaInAs, GaInP, and/or GaInAsP and have a thickness between about 0.05 μm and about 0.50 μm. In some embodiments of the present disclosure, a first metamorphic junction 140 may be constructed of an alloy that includes AlGaInAs. For example, a first metamorphic junction 140 may have the composition of abut $Al_{0.14}Ga_{0.57}In_{0.29}As$. In some embodiments, the aluminum concentrations in the first metamorphic junction 140 may be between 5 mol % and about 25 mol %, with corresponding changes in the gallium fraction. In some embodiments, a first metamorphic junction 140 may be constructed of an alloy that includes GaInAsP, for example with a composition of about $Ga_{0.5}In_{0.5}As_{0.57}P_{0.43}$. In some embodiments of the present disclosure, a first metamorphic junction 140 may include dopants, for example zinc, at a concentration between about 2.1e16 atoms zinc/cm³ and about 1.0e17 atoms zinc/cm³, and selenium at a concentration between 1e16 atoms Se/cm³ and 4e18 atoms Se/cm³. In some embodiments, silicon or sulphur may replace the selenium atoms.

In some embodiments of the present disclosure, a metamorphic tunnel junction may be constructed of an alloy that includes least one of GaAsSb:C, GaInAs:Se, GaInP:Se, AlGaInAs:C, AlGaInAs:Se, AlInAs:C, AlInAs:Se, AlInAs:Zn, AlGaInAs:Zn, GaInP:Zn, GaInP:C and/or AlGaAsSb:C. Further, a metamorphic tunnel junction may include a first layer (not shown in FIG. 1) and a second layer (not shown), each having a thickness between about 10 nm and about 200 nm. In some embodiments of the present disclosure, the first layer of a metamorphic tunnel junction 150 may be constructed of $GaAs_{0.73}Sb_{0.27}$:C, with the second layer of the metamorphic tunnel junction 150 constructed of $Ga_{0.70}In_{0.30}As$:Se. The Se dopant and/or carbon dopant may be present at a concentration between about 1e18 atoms/cm³ and about 1e20 atoms/cm³. In some embodiments of the present disclosure, the first layer of a metamorphic tunnel junction 150 may be constructed of an alloy that includes $GaAs_{0.73}Sb_{0.27}$:C, with the second layer of the metamorphic tunnel junction 150 constructed of an alloy including $Ga_{0.32}In_{0.78}P$:Se. The Se dopant and/or the carbon dopant may be present at a concentration between about 1e18 atoms/cm³ and about 1e20 atoms/cm³. In some embodiments of the present disclosure, the first layer of a metamorphic tunnel junction 150 may be constructed of an alloy that includes $Al_{0.30}Ga_{0.41}In_{0.29}As$:C, with the second layer of the metamorphic tunnel junction 150 constructed of an alloy that includes $Al_{0.30}Ga_{0.41}In_{0.29}As$:Se. The Se dopant and/or the carbon dopant may be present at a concentration between about 1e18 atoms/cm³ and about 1e20 atoms/cm³. In some embodiments of the present disclosure, the first layer and the second layer may both have a thickness between 10 nm and 200 nm. In some embodiments of the present disclosure, the combined thickness of the first layer and the second layer may be between 10 nm and 200 nm.

In some embodiments of the present disclosure, a second metamorphic junction 160 may be constructed of an alloy that includes GaInAs. For example, a second metamorphic junction may be constructed of an alloy that includes $Ga_{0.70}In_{0.30}As$. In some embodiments of the present disclosure, a substrate may be constructed of a material that includes at least one of GaAs, Ge, Si, and/or InP. In some embodiments of the present disclosure, a substrate may further include a silicon or a zinc dopant. In some embodiments of the present disclosure, a substrate may have an offcut towards the (111)B plane of the substrate.

FIG. 2 illustrates that a method 200 for manufacturing a device 100, like that shown in FIG. 1, may include, in order, a first depositing 210 of a structure 120 made of a plurality of step-graded buffer layers onto a substrate 110, a second depositing 220 of a metamorphic contact layer 130 onto the structure 120, a third depositing 230 of a first metamorphic junction 140 onto the contact layer 130, a fourth depositing 240 of a metamorphic tunnel junction 150 onto the first metamorphic junction 140, and a fifth depositing 250 of a second metamorphic junction 160 onto the metamorphic tunnel junction 150. After these depositing steps, the substrate 110 and the structure 120 may be removed from the device 100, resulting in a device 100 having, among other things, improved performance characteristics, as shown herein. In some embodiments of the present disclosure, the substrate 110 and the structure 120 may be removed sequentially in two steps. For example, the substrate 110 may be removed in a first etching step (not shown in FIG. 2) using a first chemical that selectively removes the elements making up the substrate 110. As a result, essentially all of the substrate 110 may be etched away, exposing the underlying structure 120 containing a plurality of buffer layers. Then, in similar fashion, the structure 120 containing the plurality of buffer layers may be removed in a second etching step (not shown) using a second chemical that selectively removes the elements making up the structure 120. As a result, essentially all of the structure 120 may be etched away, exposing the underlying metamorphic contact layer 130. In some embodiments of the present disclosure, at least one of a substrate 110 or a structure 120 containing a plurality of buffer layers may be removed by an epitaxial lift off technique. Note that a method 200 like that shown in FIG. 2 may include other steps, known to one of ordinary skill in the art.

Referring again to FIG. 1, in some embodiments of the present disclosure, a first contact 170 (e.g. gold, silver, etc.) may be deposited onto the exposed metamorphic contact layer 130. As shown herein, since the structure 120 made up of a plurality of buffer layers is removed after the device has been grown, and is not incorporated into the final device used in the field, this method of making a TPV device provides a more flexible manufacturing process, as it enables buffer materials to be used that are not transparent and/or conductive.

In some embodiments of the present disclosure, a first depositing 210 of a structure 120 that includes a plurality of buffer layers may be performed at a temperature between about 500° C. and about 800° C. In some embodiments of the present disclosure, a first depositing 210 of a structure 120 that includes a plurality of buffer layers may be performed at a growth rate between about 0.1 μm/hr and about 50 μm/hr. In some embodiments of the present disclosure, a first depositing 210 of a structure 120 that includes a plurality of buffer layers may be performed at a strain-grading rate between about 0.1% and about 4.0%. In some embodiments of the present disclosure, a first depositing 210 of a structure 120 that includes a plurality of buffer layers may be performed at a V/III ratio between about 1:1 and about 1000:1.

In some embodiments of the present disclosure, a method may include a first intermediate depositing (not shown in FIG. 2) of a strain "overshoot" layer (not shown) having a thickness of about 1 μm, performed after the first depositing and before the second depositing (described below), such that the strain "overshoot" layer is positioned between the structure 120 and the metamorphic contact layer 130. In some embodiments of the present disclosure, a strain "overshoot" layer may be constructed of an alloy having a composition of GaInP between about $Ga_{0.51}In_{0.5}P$ and about $Ga_{0.2}In_{0.8}P$. Further, in some embodiments of the present disclosure, a method may further include a second intermediate depositing (not shown) of a "step-back" layer (not shown) lattice-matched to the in-plane lattice constant of the overshoot layer and having a thickness of about 1 μm, performed after the first intermediate depositing and before the second depositing, such that the "step-back" layer is positioned between the strain "overshoot" layer and the metamorphic contact layer 130. In some embodiments of the present disclosure, a "step-back" layer may be constructed of an alloy having a composition of at least one of GaInAs, AlInAs, AlGaInAs and/or GaInP. In some embodiments of the present disclosure, at least one of a strain "overshoot" layer and/or a "step-back" layer may be deposited at a temperature between about 500° C. and about 800° C. at a pressure of about one atmosphere.

In some embodiments of the present disclosure, a device 100 may be grown on an InP substrate 110, with a structure 120 that includes buffer layers composed of alloys $InAs_xP_{1-x}$ with $0<x<0.4$ or $Ga_yIn_{1-y}As$ with $0.30<y<0.47$; a metamorphic contact layer 130 of $Ga_{0.31}In_{0.69}As$; a first metamorphic junction 140 of $Al_{0.10}Ga_{0.21}In_{0.69}As$ or $Ga_{0.16}In_{0.84}As_{0.69}P_{0.31}$ with bandgaps of approximately 0.73 eV; a second metamorphic junction 160 of $Ga_{0.31}In_{0.69}As$ with a bandgap of 0.58 eV; and a metamorphic tunnel junction 150. In some embodiments of the present disclosure, a metamorphic tunnel junction 150 may be composed of alloys such as GaInAs, AlGaInAs, GaAsSb, AlAsSb, AlInAs and/or InAsP. Variants of this device 100 are possible, with the bandgap of the first metamorphic junction 140 in the range of 0.6-0.75 eV and the second metamorphic junction 160 in the range of 0.5-0.7 eV, with appropriate changes in the compositions of all layers in the structure 100.

In some embodiments of the present disclosure, the second depositing 220 of the metamorphic contact layer 130 may be performed in two steps, a first growing step to produce a first layer of the metamorphic contact layer 130, and a second growing step to produce a second layer of the metamorphic contact layer 130. The first growing step of the second depositing 220 may be performed at a temperature between about 400° C. and about 800° C., to produce a highly-Se-doped first layer having between about 1e18 and about 1e10 Se atoms per cubic centimeter and a thickness between about 0.1 μm and about 1.0 μm. The Se dopant may be provided by an $H_2Se$ gas. The second growing step of the second depositing 220 may be performed at a temperature between about 600° C. and about 800° C. to produce a lower-Se-doped second layer having between about 1e17 and about 1e19 Se atoms per cubic centimeter and a thickness between greater than zero μm and about 1.0 μm. Again, Se may be provided by an $H_2Se$ gas.

In some embodiments of the present disclosure, a third depositing 230 of the first metamorphic junction 140 may be completed at a temperature between about 500° C. and about 800° C. As shown herein, the temperature for the third depositing 230 of the first metamorphic junction 140 may be selected to reduce the oxygen present during the third depositing to a concentration less than 1e16 atoms/cm$^3$, resulting in a better performing final TPV device 100, as shown herein. In some embodiments of the present disclosure, the third depositing 230 of the first metamorphic junction 140 may be completed at a V/III ratio between about 1:1 and about 1000.

In some embodiments of the present disclosure, a fifth depositing 250 of a second metamorphic junction 160 may be performed at a temperature between about 500° C. and about 800° C. In some embodiments of the present disclosure, a fifth depositing 250 of a second metamorphic junction 160 may be performed at a V/III ratio between about 1:1 and about 1000:1. Although the depositing of two metamorphic junctions is described herein, more than two metamorphic junctions may be deposited, according to some embodiments of the present disclosure. For example, multiple junctions may be achieved by varying the aluminum concentration in the metamorphic junctions such that the top junction has the highest aluminum concentration and the bottom junction the lowest aluminum concentration.

In some embodiments of the present disclosure, a method may be performed using at least one of organometallic vapor phase epitaxy (OMVPE), hydride vapor phase epitaxy (HVPE), and/or molecular beam epitaxy (MBE). In some embodiments of the present disclosure, a method may be performed at a pressure between about 0.1 atm and about 5 atm.

Figure 3A:
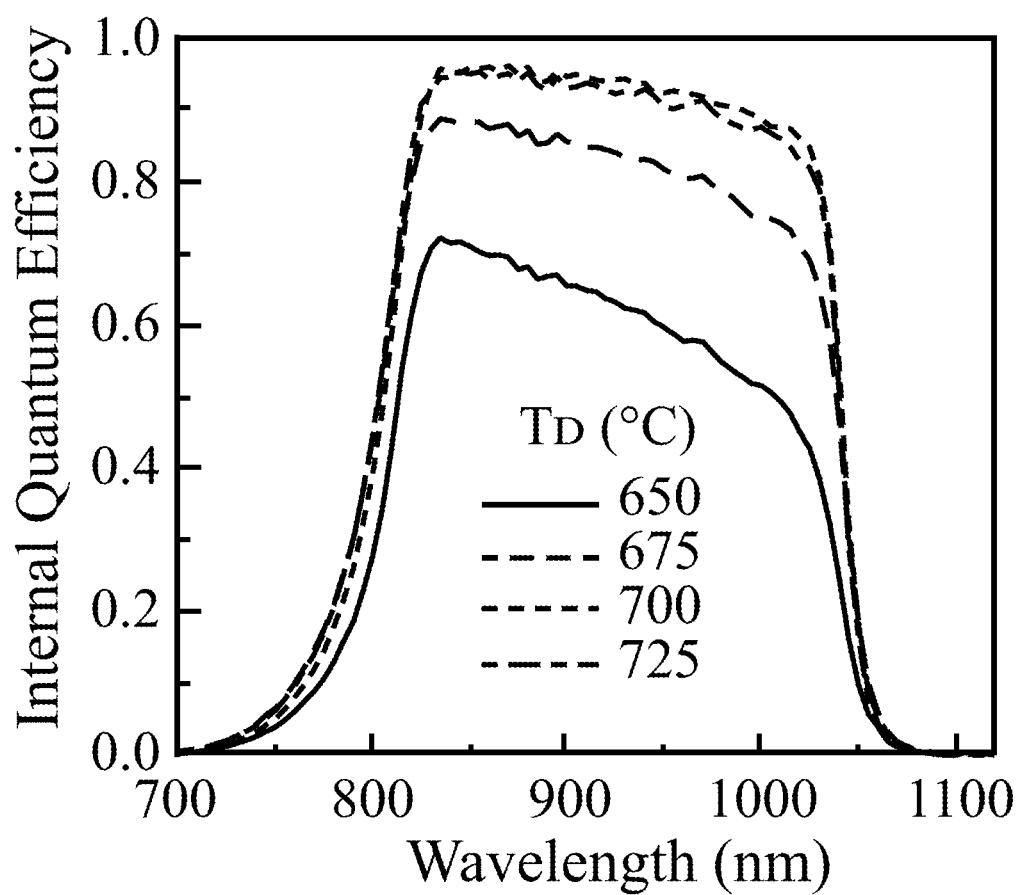
FIGS. 3A and 3C illustrate internal quantum efficiency curves and current density-voltage curves for ~1.2 eV $Al_{0.14}Ga_{0.57}In_{0.29}As$ metamorphic junctions incorporated into solar cells grown with varying deposition temperatures at a constant V/III ratio equal to about 23, according to some embodiments of the present disclosure
Figure 3B:
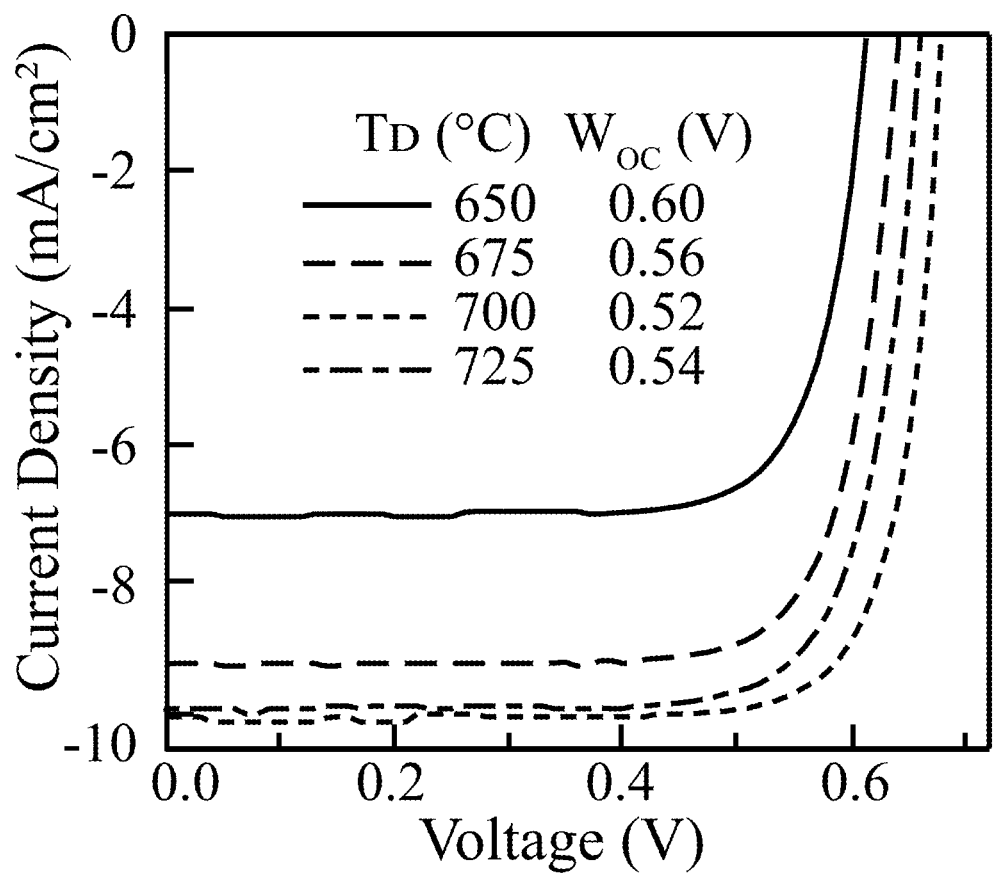
FIGS. 3B and 3D illustrate internal quantum efficiency curves and current density-voltage curves when varying the V/III ratio at a constant deposition temperature equal to about 700° C., according to some embodiments of the present disclosure.
Figure 3C:
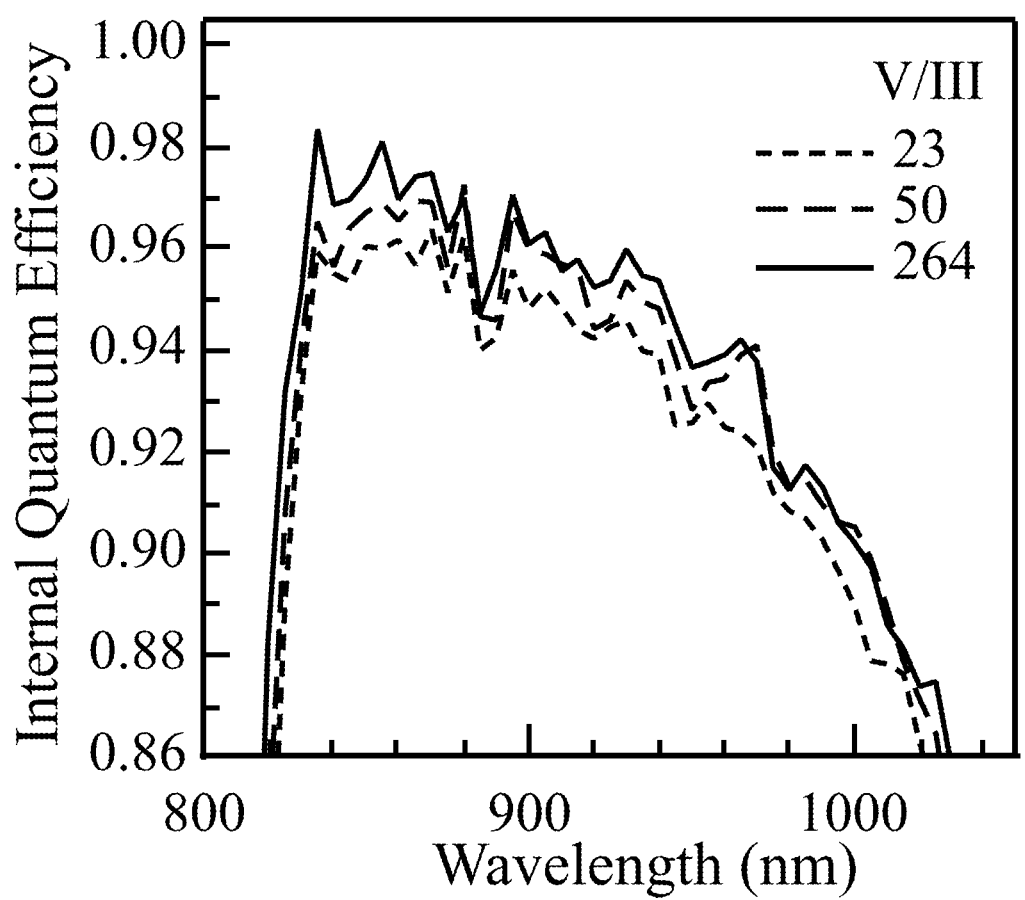
Figure 3D:
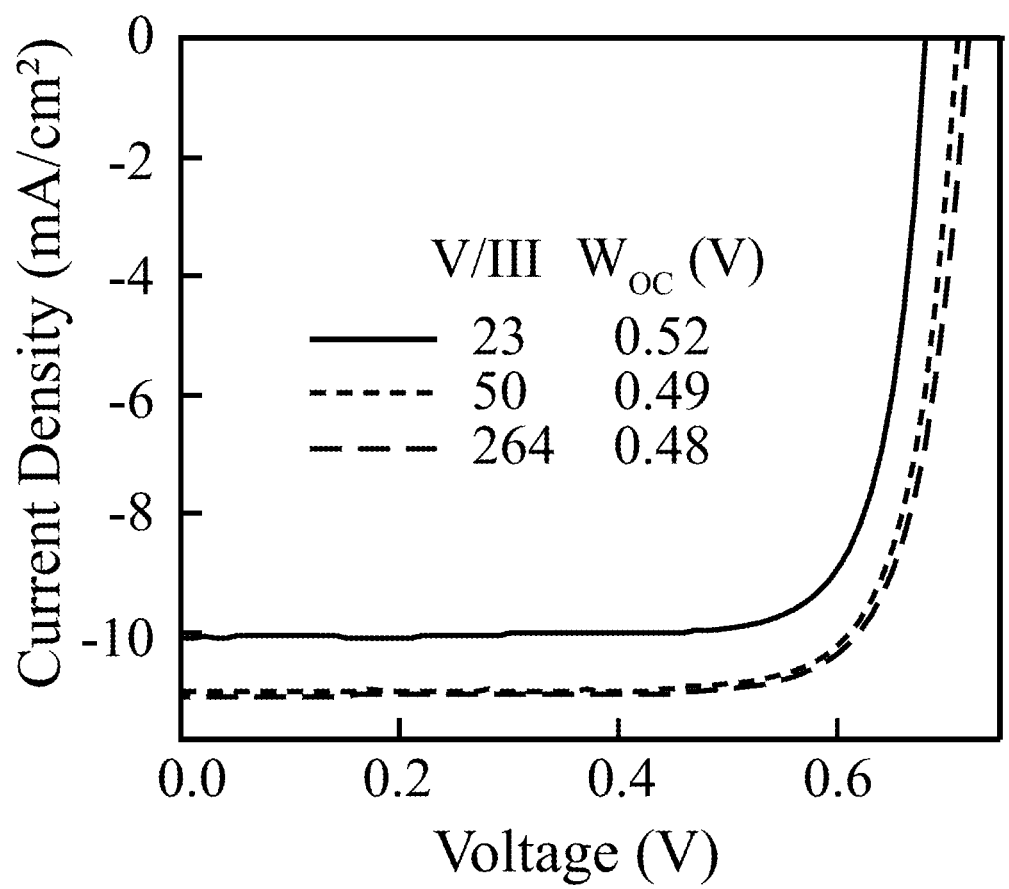

Experimental Results:

The effect of growth conditions on the quality of metamorphic 1.2 eV $Al_{0.14}Ga_{0.57}In_{0.29}As$ material intended for the first metamorphic (i.e. top) junction of an exemplary two-junction device was tested. FIGS. 3A and 3C show the IQE and one-sun light J-V for single-junction $Al_{0.14}Ga_{0.57}In_{0.29}As$ devices grown with varying growth temperature $T_D$ and a constant V/III ratio=23. The maximum IQE increased from ~72% at $T_D$=650° C. up to ~96% at 700° C. The IQE decreases slightly as $T_D$ increased further to 725° C. As expected, the trends in J-V short-circuit current ($J_{SC}$) matched those in the IQE, increasing with temperature up to about 700° C., then decreasing at about 725° C. Similarly, the open circuit voltage ($V_{OC}$) increased from 0.613 V to 0.680 V between 650 and 700° C. then decreased to 0.660 at 700° C. The bandgap-$V_{OC}$ offset ($W_{OC}$), an indicator of the material quality, is listed in the figure legend. FIGS. 3B and 3D show the IQE and J-V for $Al_{0.14}Ga_{0.57}In_{0.29}As$ devices grown with varying V/III and a constant $T_D$=700° C. The maximum IQE increased slightly with V/III, up to ~98% at the highest V/III of 264. $J_{SC}$ and $V_{OC}$ also increased with V/III, with $V_{OC}$ peaking at 0.720 V at the highest V/III, corresponding to a $W_{OC}$ of 0.48 V.

Figure 3E:
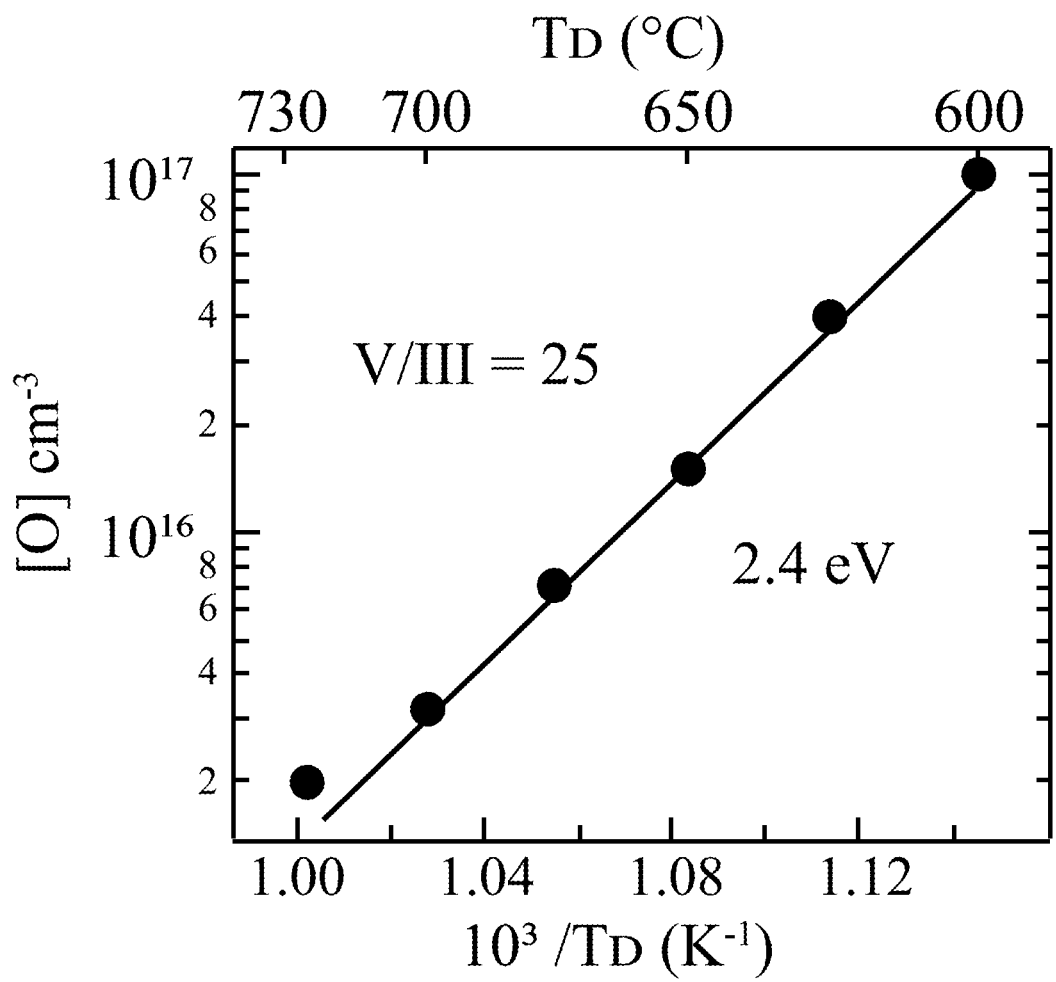
FIGS. 3E and 3F illustrate oxygen concentrations in $Al_{0.14}Ga_{0.57}In_{0.29}As$ as a function of deposition temperature, according to some embodiments of the present disclosure.
Figure 3F:
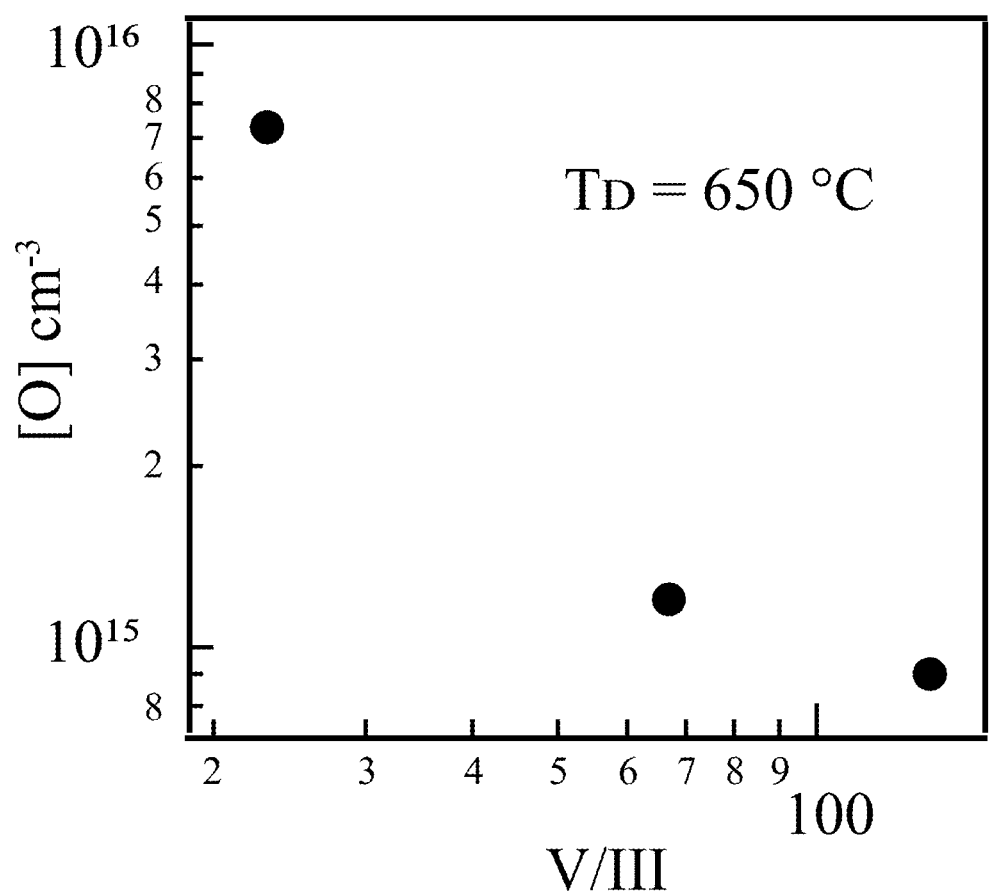

The incorporation of oxygen in Al-containing III-V materials is a common issue, due to the large strength of the Al—O bond. Oxygen forms a deep level defect in III-V materials, and its presence reduces the performance of minority carrier devices such as solar cells. Secondary ion mass spectrometry was performed on metamorphic $Al_{0.14}Ga_{0.57}In_{0.29}As$ junction as a function of $T_D$ and V/III in order to understand oxygen incorporation in devices. FIGS. 3E and 3F show the measured [O] as a function of $T_D$ and V/III, respectively. [O] decreased exponentially with $T_D$, from $1 \times 10^{17}$ to $2 \times 10^{15}$ cm$^{-3}$, as $T_D$ increased from 600° C. to 725° C. An effective activation energy, which likely encompasses various adsorption and reaction processes, of 2.4 eV was calculated. This was significantly larger than an effective energy found for OMVPE of $Al_{0.3}Ga_{0.7}As$. The trend in [O] vs. $T_D$ correlates closely with the improvement in $V_{OC}$ and QE with $T_D$, suggesting that reductions in [O] are at least partially responsible for the device improvement. Similarly, [O] decreases as a function of V/III, dropping nearly an order of magnitude as V/III increased from 25 to 67 for samples grown at $T_D$=650° C. [O] decreased only slightly with further V/III increase to 134. These trends in [O] with V/II correlate closely with device performance as a function of V/III, with the $W_{OC}$ decreasing by 30 mV between V/III=23 and 67, but only improving 10 mV more between V/III=67 and 264. Among other things, these results suggest that reduced [O] concentration is driving the performance improvement with increasing V/III.

The emitter and base doping density varied as a function of V/III and $T_D$, though no attempt was made to control these parameters in these initial sets of experiments. The base doping decreased from $1.0 \times 10^{17}$ to $2.1 \times 10^{16}$ cm$^{-3}$ as temperature increased from 650° C. to 725° C. It is possible that part of the improvement in IQE with temperature could be due to an increasing minority carrier diffusion length with decreasing doping density. However, the concurrent increase in $V_{OC}$ suggests that the improvement is due to reduced defect density, because decreasing doping density increases the $J_{01}$ component of the dark current, which should decrease $V_{OC}$. To further clarify the effect of doping, a series of $Al_{0.14}Ga_{0.57}In_{0.29}As$ devices were grown with varying base doping at constant $T_D$ and V/III.

Figure 4A:
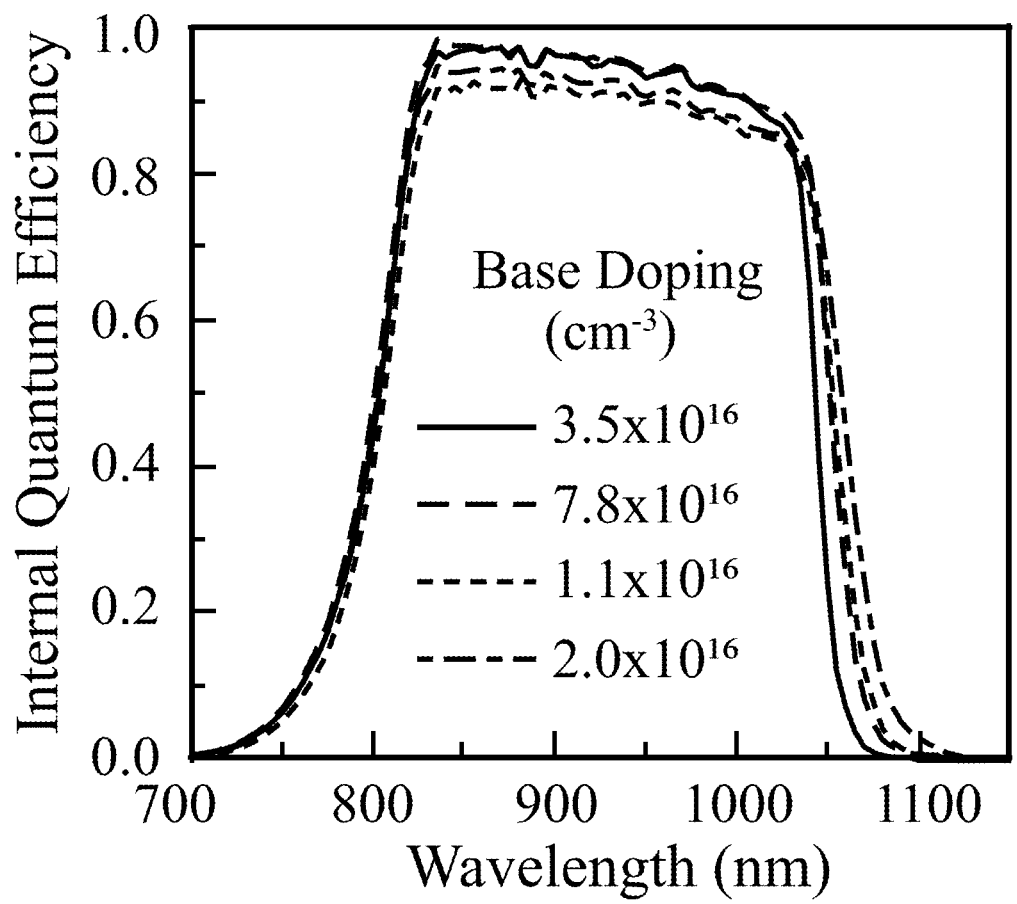
FIG. 4A illustrates internal quantum efficiencies for metamorphic $Al_{0.14}Ga_{0.57}In_{0.29}As$ metamorphic junctions incorporated into solar cells with varying base doping, according to some embodiments of the present disclosure.
Figure 4B:
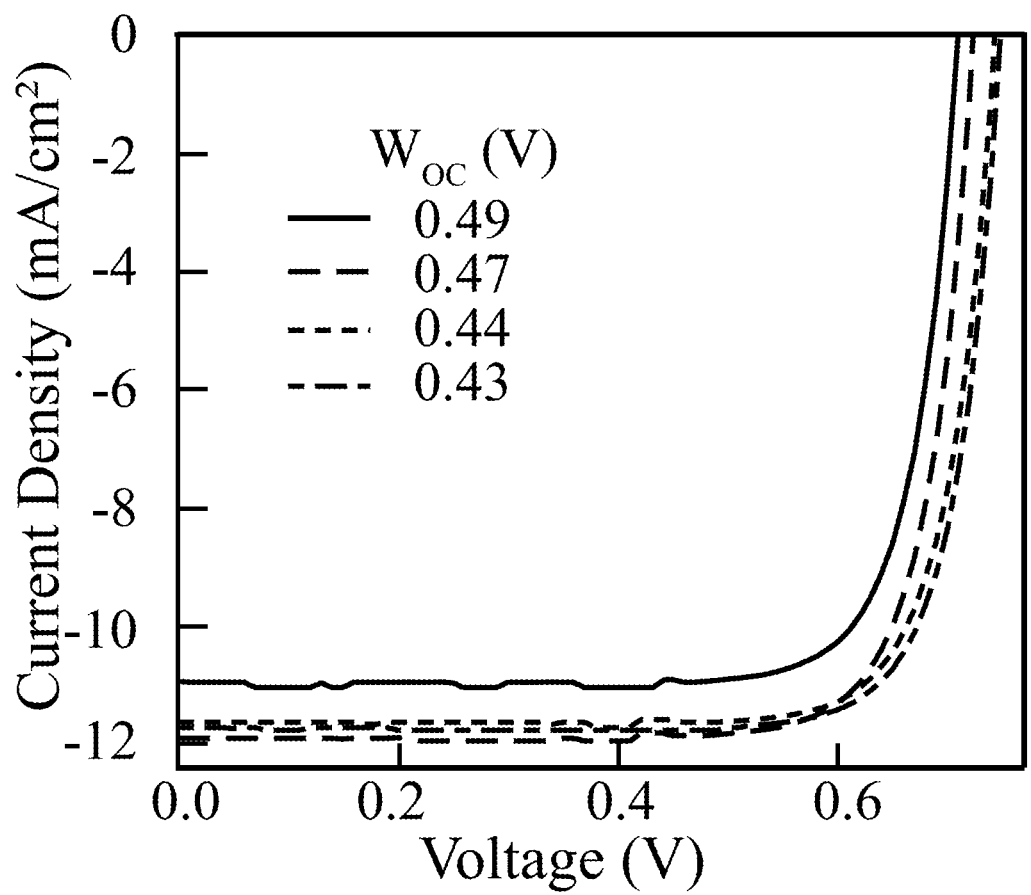
FIG. 4B illustrates light current density-voltages for metamorphic $Al_{0.14}Ga_{0.57}In_{0.29}As$ metamorphic junctions incorporated into solar cells with varying base doping, according to some embodiments of the present disclosure.
Figure 4C:
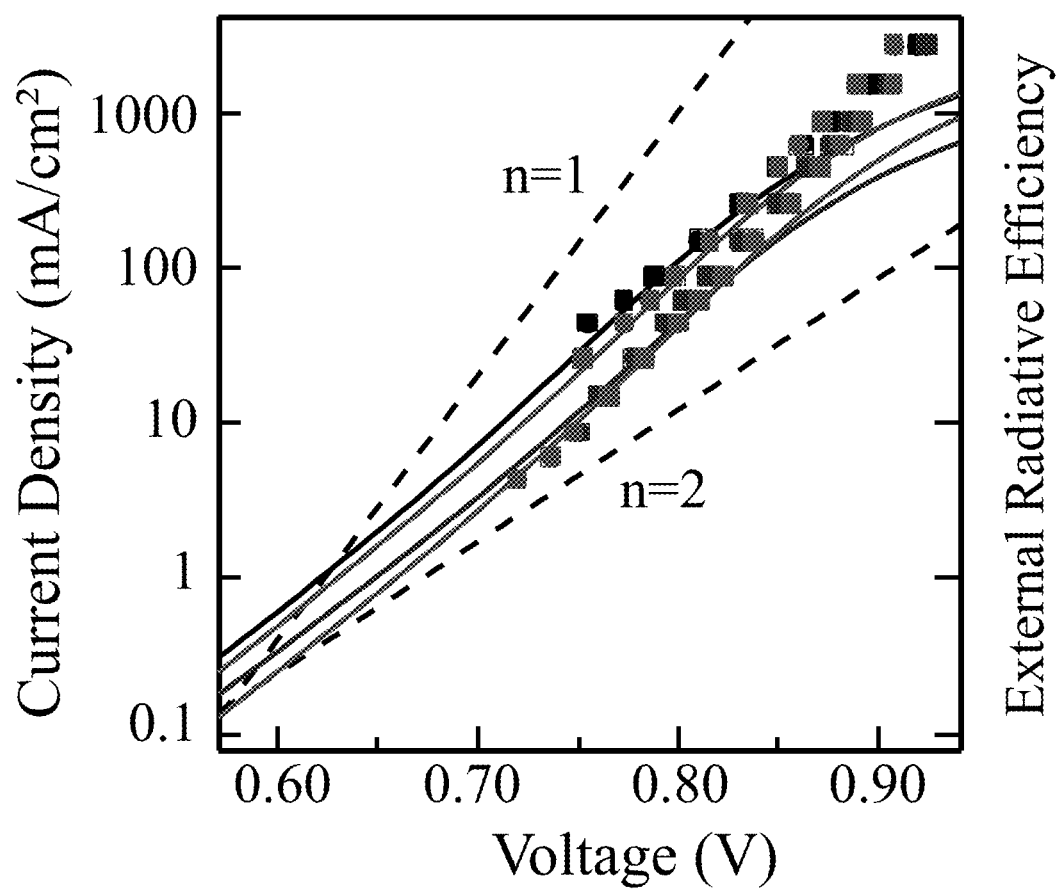
FIG. 4C illustrates dark current density-voltages for metamorphic $Al_{0.14}Ga_{0.57}In_{0.29}As$ metamorphic junctions incorporated into solar cells with varying base doping, according to some embodiments of the present disclosure.

FIGS. 4A and 4B show the effect of base doping density on IQE and J-V performance of $Al_{0.14}Ga_{0.57}In_{0.29}As$ devices grown at 700° C. with V/III=67. The IQE decreased somewhat, though not linearly, with increasing base doping from $3.5 \times 10^{16}$ to $2.0 \times 10^{17}$ cm$^{-3}$. The absorption edge in the IQE (and EQE, not shown) becomes more gradual with doping density and shifts to longer wavelength, implying that the bandgap decreases with base doping density. The $V_{OC}$ increased from 0.71 to 0.75 V with doping density, corresponding to a $W_{OC}$ decrease by 60 mV. It is noted that the $W_{OC}$ of the metamorphic junction with $1.1 \times 10^{17}$ cm$^{-3}$ doping rapidly decreased to 0.41 V as the $J_{SC}$ increased to 22 mA/cm$^2$ with removal of the graded buffer (described below). The dark J-V and electroluminescence from these devices was analyzed to better understand the improvement in $W_{OC}$ with base doping. FIG. 4C shows the dark J-V as curves, with electroluminescence J-V plotted as points and FIG. 4D shows the electroluminescence external radiative efficiency (photons out divided by electrons in) for these devices.

Figure 4D:
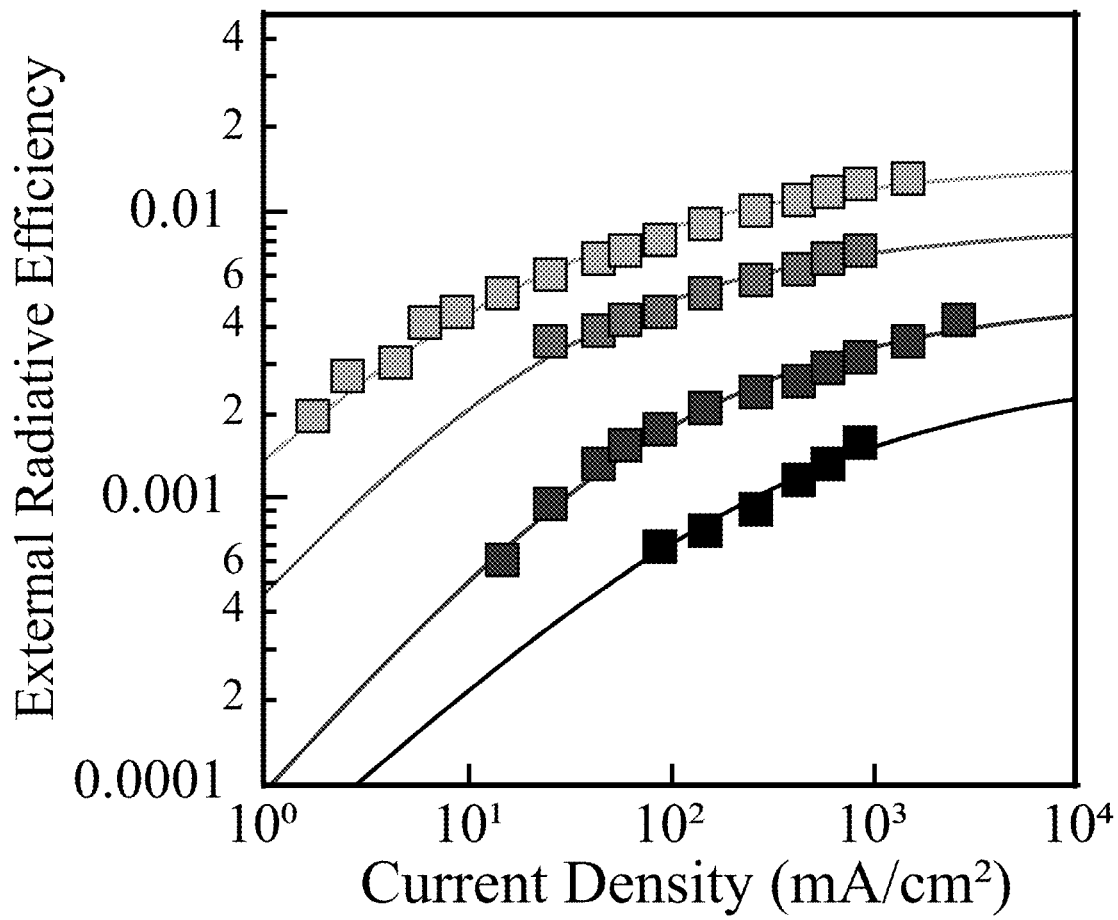
FIG. 4D illustrates electroluminescence external radiative efficiencies for metamorphic $Al_{0.14}Ga_{0.57}In_{0.29}As$ metamorphic junctions incorporated into solar cells with varying base doping, according to some embodiments of the present disclosure.
Figure 4E:
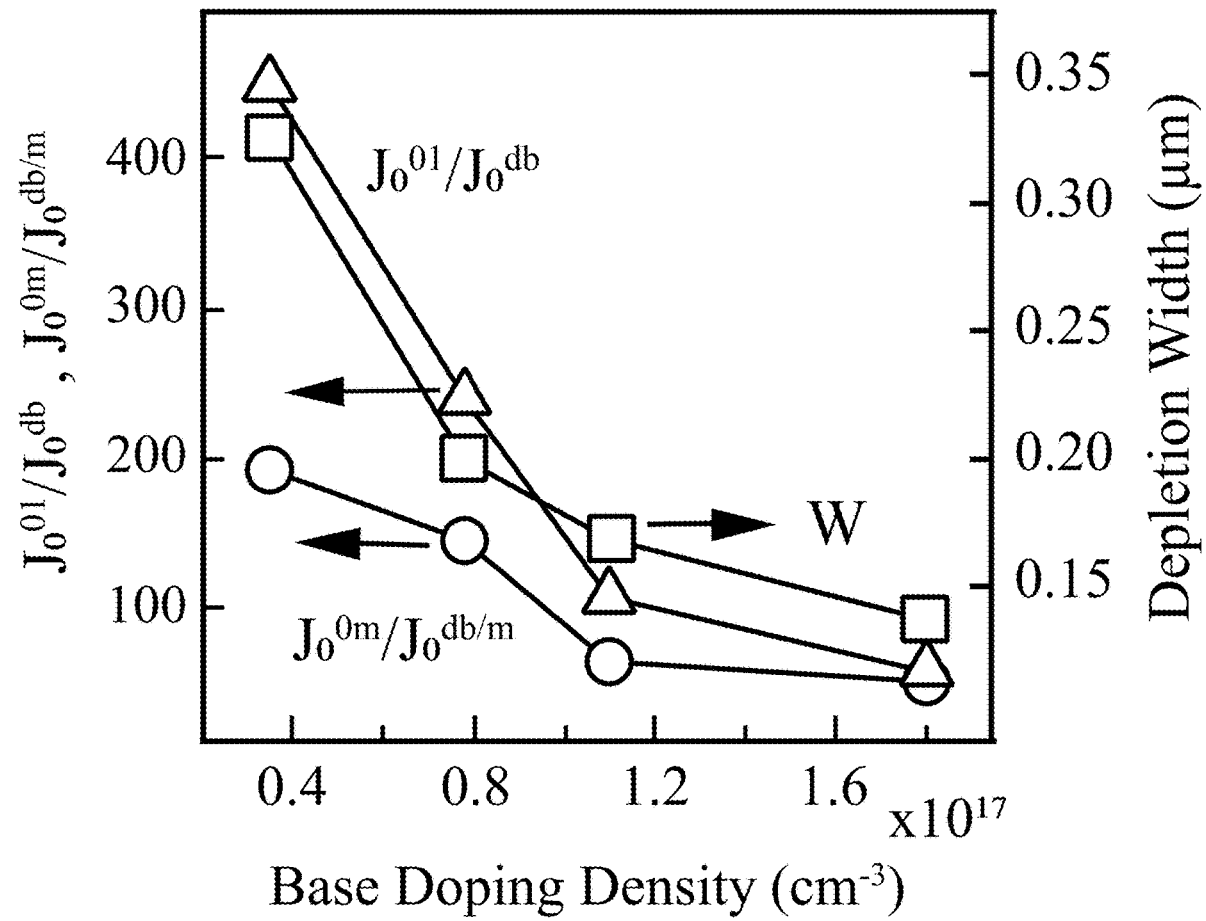
FIG. 4E illustrates the results of external radiative efficiency and dark current fitting analysis using 2-diode model to extract $J_0^{01}/J_0^{db}$ and $J_0^{0m}/J_0^{db/m}$ the ratios of dark current in the n=1 and n=m device regions to that derived for perfect junctions in the detailed balance limit (left axis) and junction depletion width (right axis) as a function of doping density, according to some embodiments of the present disclosure.
Figure 4F:
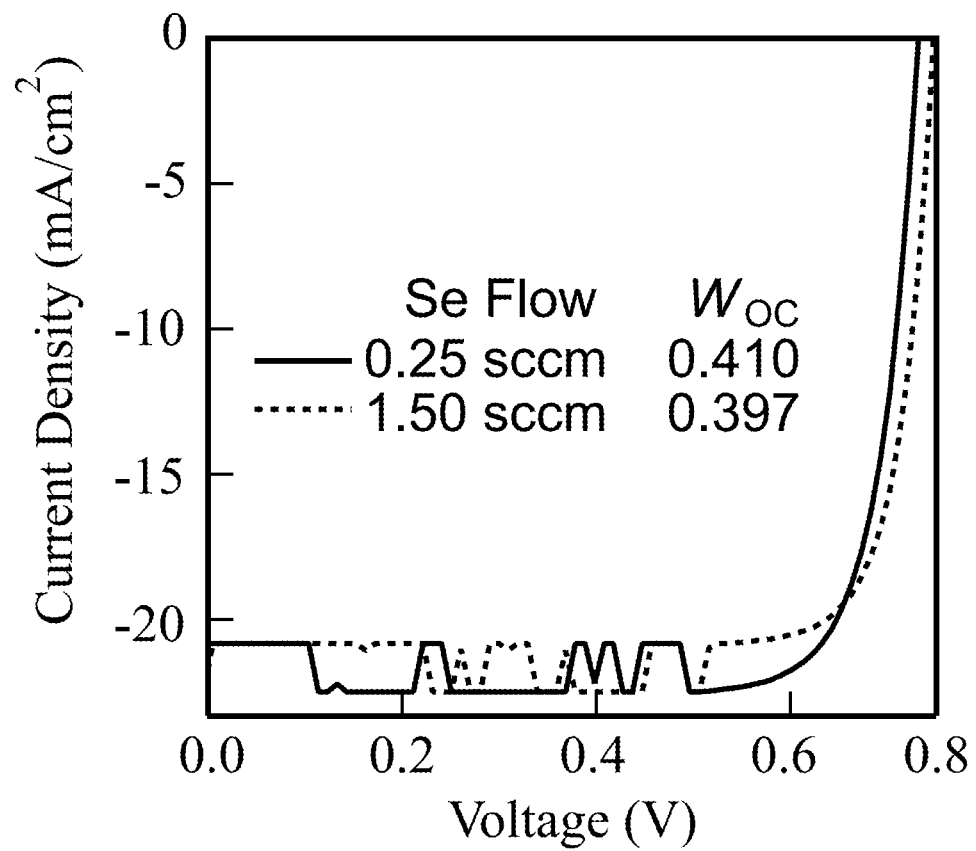
FIG. 4F illustrates a comparison of two $Al_{0.14}Ga_{0.57}In_{0.29}As$ solar cells grown with varying emitter doping, according to some embodiments of the present disclosure. The grades were removed from these devices.

The curves FIG. 4D illustrates fits of the external radiative efficiency to the generalized optoelectronic model of Geisz et al. (*Journal of Photovoltaics*, page 1827, 2015), which uses a two-diode model to characterize a device. The model also includes fitting to the dark J-V. Fitting of these data allows extraction of the parameters $J_0^{01}/J_0^{db}$ and $J_0^{0m}/J_0^{db/m}$ which represent the dark current-densities in the quasi-neutral and space charge regions of the device, respectively, normalized to the dark current-densities calculated in these regions for a perfect junction using the detailed balance model. m is the ideality factor of the second diode, which is usually assumed to be two, though in the present case is 1.7-1.8 based on fits to the dark J-V. $J_0^{01}/J_0^{db}$ is inversely related to doping density, whereas $J_0^{0m}/J_0^{db/m}$ is not dependent on doping density to first order. FIG. 4E plots these fit parameters as a function of base doping. Both $J_0^{01}/J_0^{db}$ and $J_0^{0m}/J_0^{db/m}$ decrease strongly with base doping, implying that both components of the diode current are impacted by the base doping density. The explanation for this trend is straightforward in the case of $J_0^{01}/J_0^{db}$ because of the inverse dependence on doping density. It may be hypothesized that the decrease in $J_0^{0m}/J_0^{db/m}$ with doping density is due to narrowing of the depletion width (W). Given that there is oxygen present in these Al-containing materials, and that oxygen is a deep level defect in III-Vs, it follows that we can drive down $J_0^{01}/J_0^{db}$ by narrowing W with increasing base doping density. For reference, W, calculated from the depletion approximation, is plotted on the right axis of FIG. 4E. $J_0^{0m}/J_0^{db/m}$, which should have a direct dependence W, correlates closely with W providing validation for this hypothesis.

Figure 5:
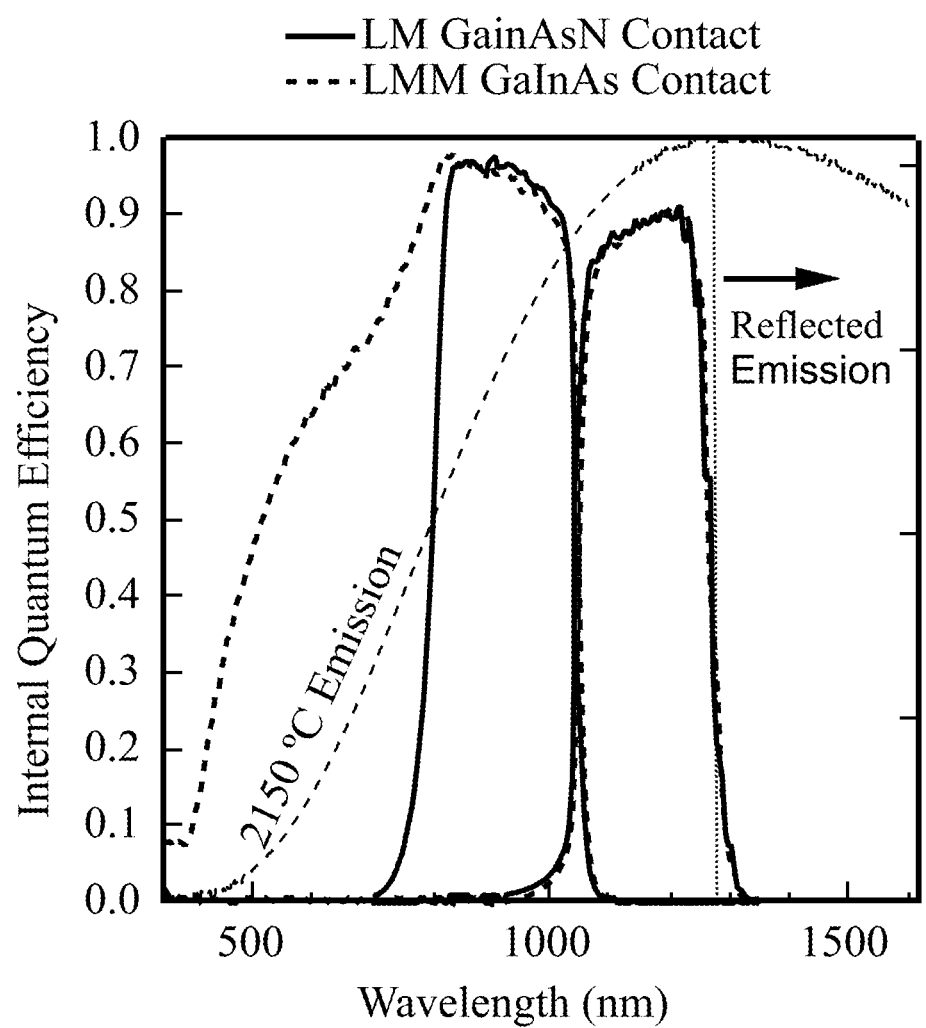
FIG. 5 illustrates internal quantum efficiency for tandem devices with different contact layer types, according to some embodiments of the present disclosure. A structure of graded buffer layers was removed in the GaInAs case.

To facilitate the removal of the structure containing the graded buffer layers, the contact layer should be grown after the structure, instead of before it. $Ga_{1-x}In_xAs$ has many desirable properties for a contact layer material, given its high electron effective mass and relatively low bandgap (1.0 eV) at the lattice constant of interest. Growing the contact layer after the first grade reduces the annealing tolerance required as well. As described herein, a two-step method was developed for growing a $Ga_{0.70}In_{0.30}As$ contact layer having a first highly-Se-doped 0.1 µm-thick layer, deposited at about 550° C., and a second lower-doped 0.2 µm-thick layer grown at 700° C., which matches the growth temperature of the junction. FIG. 5 shows the IQE of two $Al_{0.14}Ga_{0.57}In_{0.29}As/Ga_{0.70}In_{0.30}As$ tandem devices grown with different contacts. The emission from a 2150° C. radiator is plotted on the right axis as a broken line for reference. One tandem features a $Ga_{0.93}In_{0.07}As_{0.97}N_{0.03}$ contact layer grown in front of the structure having the graded buffer layers, lattice-matched to GaAs, while the other uses the two-step $Ga_{0.70}In_{0.30}As$ contact layer grown after the graded buffer (i.e. structure), lattice-matched to the tandem. In the latter case, the structure including the graded buffer layers was removed. The removal of this structure considerably increased short-wavelength collection in the IQE, including portions of the 2150° C. spectrum the grade would otherwise absorb parasitically. Table 1 compares the contact layers in terms of resistance and material quality metrics. The specific contact resistance of the mismatched second $Ga_{0.70}In_{0.30}As$ metamorphic junction was actually lower than that of the first $Ga_{0.93}In_{0.07}As_{0.97}N_{0.03}$ metamorphic junction, with a value of $5 \times 10^{-5}$ vs. $1.2 \times 10^{-4}$ $\Omega \cdot cm^2$. The sheet resistance after contact removal increases from 10 to 151 $\Omega$/square because the current could no longer spread in the thick grade. Despite this increase, the overall series resistance, determined by fitting of the fill factor obtained from flash concentrator measurements, was lower for the GaInAs contact (0.050 $\Omega \cdot cm^2$ vs. 0.090 $\Omega \cdot cm^2$). Thus, the contact resistance was more limiting than the sheet resistance. The IQE heights for each junction are identical in both cases, and the junction voltages measured by electroluminescence listed in Table 1 are nearly identical as well. These results show that the material quality of the tandem device is unaffected by the implementation of the mismatched contact layer and removal of the structure containing the graded buffer layers.

TABLE 1

Comparison of Contact Layers

| Contact Type | $\rho_C$ ($\Omega \cdot CM^2$) | $R_{sheet}$ after removal ($\Omega$ /square) | $\rho_{Series}$ ($\Omega \cdot CM^2$) | Top/Bottom Cell Voltage @ 100 mA/cm² (V) |
|---|---|---|---|---|
| GaInAsN | $1.2 \times 10^{-4}$ | 10 | 0.090 | 0.81/0.67 |
| GaInAs | $5 \times 10^{-5}$ | 151 | 0.050 | 0.80/0.67 |

The third aspect of a TPV device that should be addressed in moving to a single-grade design is the tunnel junction. In the single-grade design considered herein, a tunnel junction should be placed in front of the 1.0 eV $Ga_{0.70}In_{0.30}As$ cell, meaning that the tunnel junction will parasitically absorb photons if it contains layers with bandgaps below the 1.2 eV top cell bandgap, as the baseline $GaAs_xSb_{1-x}$:$C/Ga_{1-x}In_xAs$:Se tunnel junction does. The effect of three different tunnel junction structures on tandem performance was compared. FIG. 6A depicts these tunnel junction designs, constructed of:

1) $GaAs_{0.73}Sb_{0.27}$:$C/Ga_{0.70}In_{0.30}As$:Se (baseline);
2) $GaAs_{0.73}Sb_{0.27}$:$C/Ga_{0.32}In_{0.78}P$:Se; or
3) $Al_{0.30}Ga_{0.41}In_{0.29}As$:$C/Al_{0.30}Ga_{0.41}In_{0.29}As$:Se.

Figure 6B:
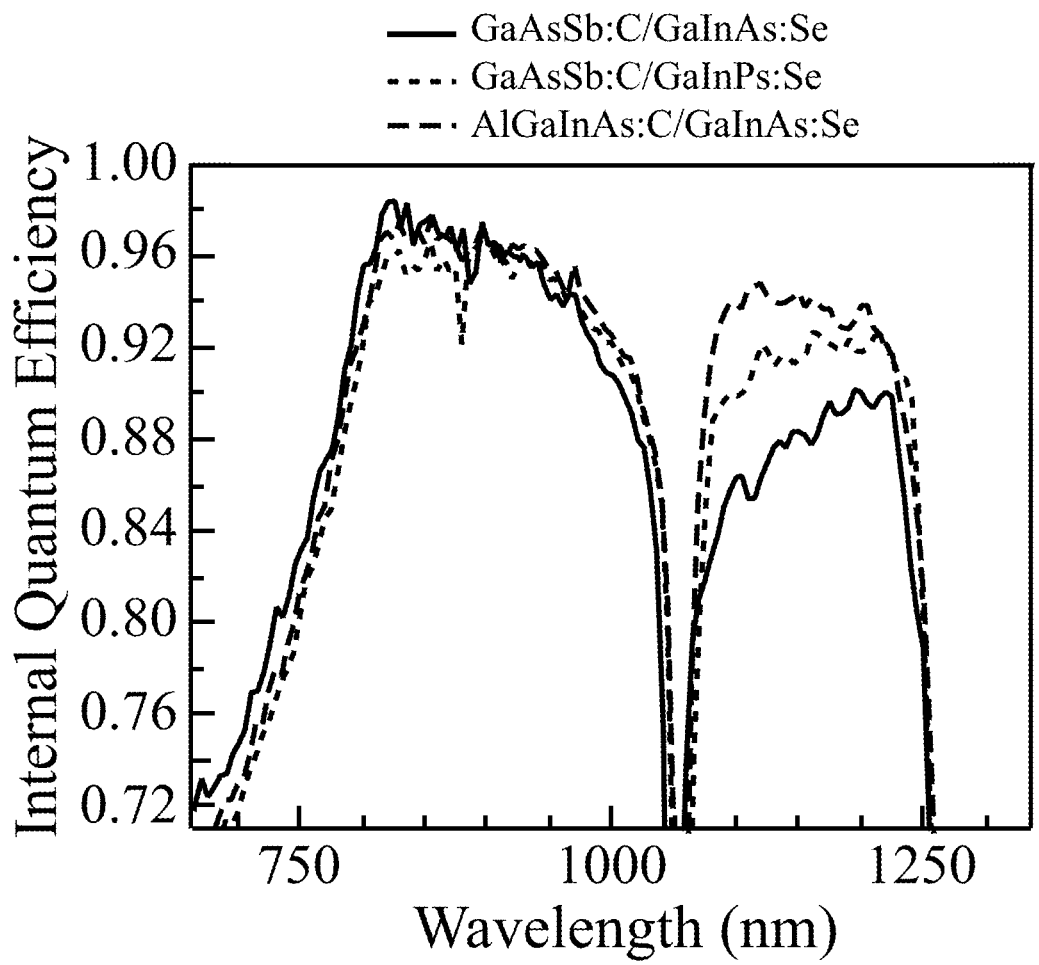
FIG. 6B illustrates the internal quantum efficiency of $Al_{0.14}Ga_{0.57}In_{0.29}As/Ga_{0.70}In_{0.30}As$ tandem devices with the three different tunnel junction structures illustrated in FIG. 6A, according to some embodiments of the present disclosure.

FIG. 6B shows the IQE for three tandem devices that included these tunnel junctions. The top and bottom junctions of the tandem were 1.2-eV $Al_{0.14}Ga_{0.57}In_{0.29}As$ and 1.0-eV $Ga_{0.70}In_{0.30}As$. The all-AlGaInAs tunnel junction was highly transparent, with a peak IQE of ~95% in the bottom cell, while the baseline GaAsSb/GaInAs tunnel junction was the most absorbing, with IQE as low as ~85% at shorter wavelengths. The IQE is positively sloped from low to higher wavelengths, characteristic of parasitic tunnel junction absorption. The GaAsSb/GaInP tunnel junction absorbed some light in the GaAsSb layer, yielding an intermediate IQE height.

Figure 6C:
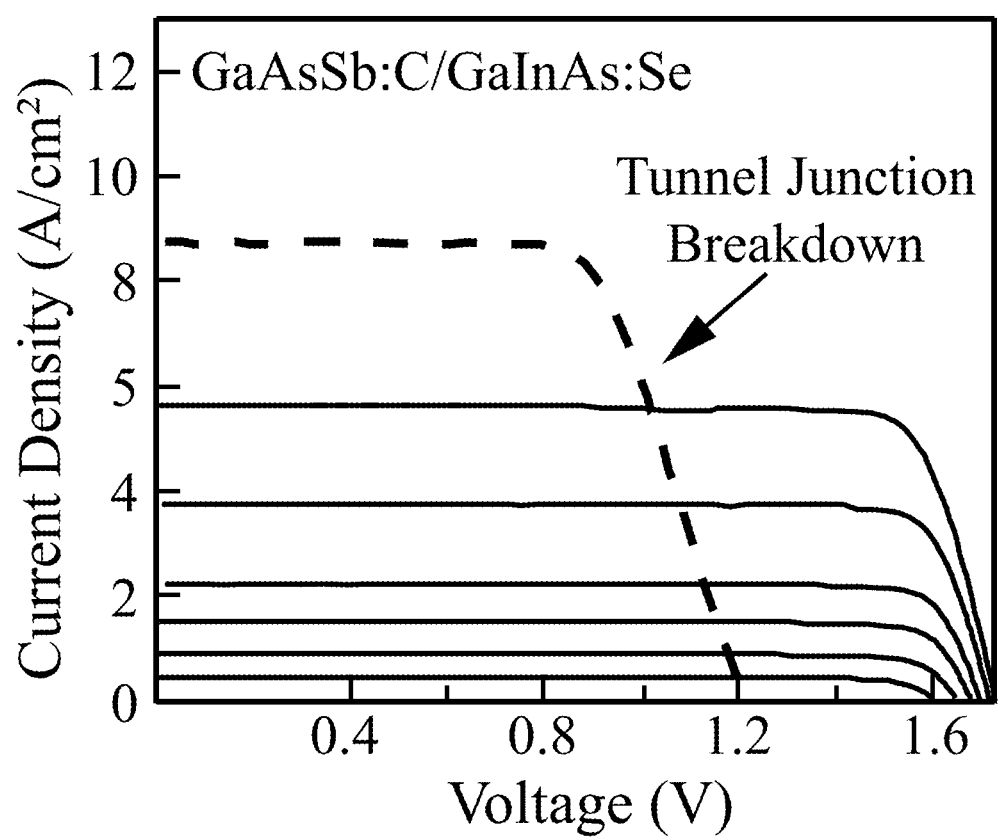
FIGS. 6C, 6D, and 6E illustrate the current density-voltage curves at varying concentration level for each tandem device illustrated in FIG. 6A, according to some embodiments of the present disclosure.
Figure 6D:
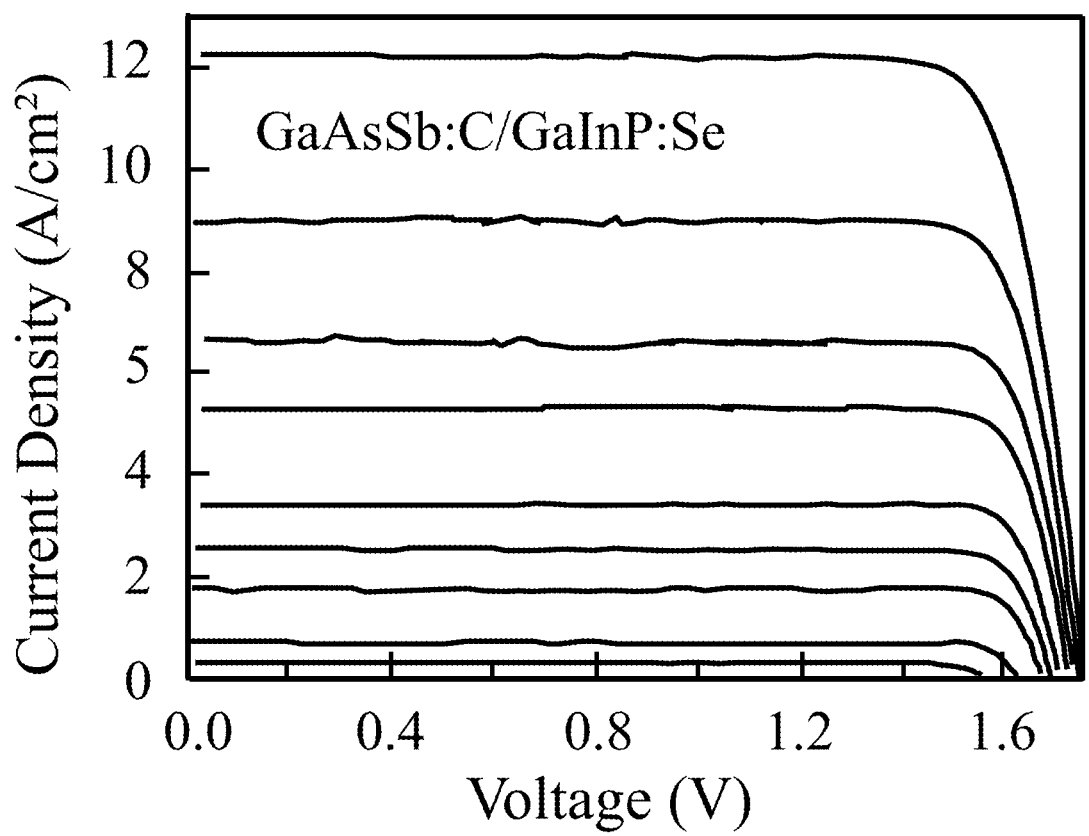
Figure 6E:
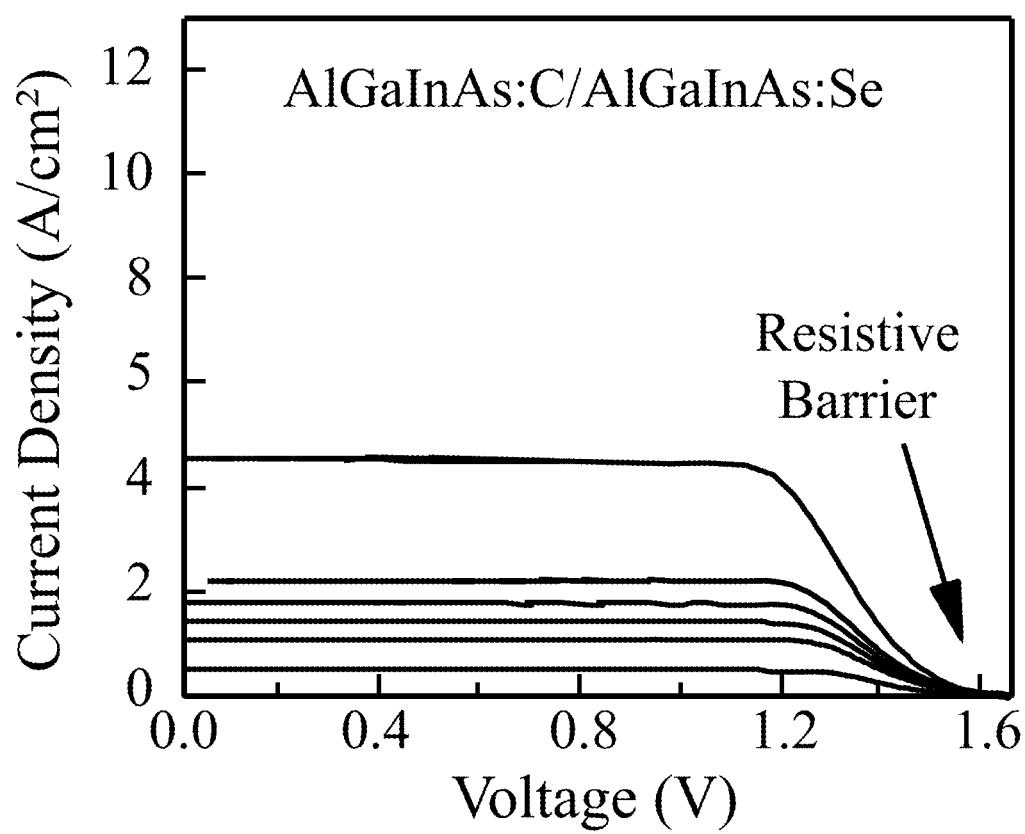

Flash concentrator measurements were performed on these devices to test each tunnel junction at high current density. FIGS. 6C through 6E show the flash J-V curves for each tandem at multiple different light levels. It is noted that the spectrum produced by the Xe flash lamp overdrives the top cell, meaning that the $V_{OC}$ and especially the fill factor are not representative of operation under the TPV spectrum. This measurement provides a valid test for the tunnel junctions, however. The GaAsSb/GaInAs tunnel junction performed well up to 5.55 A/cm² then suffered a breakdown at higher current density. The GaAsSb/GaInP tunnel junction did not exhibit tunnel junction breakdown up to the highest current density 12.2 A/cm². The all-AlGaInAs tunnel junction exhibited an internal resistive barrier at all concentrations that severely limited the fill factor, despite being the most transparent tunnel junction. $2 \times 10^{19}$ cm$^{-3}$ n-type doping was not achieved in this material, but (Al)GaInAs is difficult to p-dope with carbon, so only a p-doping level of $2 \times 10^{18}$ cm$^{-3}$ was achieved. Clearly this level is not high enough to promote tunneling through the diode. An attempt was made to dope this material with Zn, but a resistive barrier again developed near $V_{OC}$ at even one-sun, likely due to the high diffusivity of Zn. Thus, the GaAsSb/GaInP tunnel junction presently offers the best combination of transparency and high-current-density tunneling performance. P-doping in the mid-$10^{19}$ cm$^{-3}$ level is achievable in GaAsSb with carbon, and were able to n-dope GaInP to that a similar level with Se.

Estimates of the tandem device efficiency and the TPV system efficiency under the 2150° C. radiator spectrum were deduced and the power from high concentration current-voltage (IV) data, and the absorbed power by means of the reflectance data, were both estimated. The device had a lattice-mismatched GaInAs front contact 130, a 1.2-eV $Al_{0.14}Ga_{0.57}In_{0.29}As$ top junction 140, a GaAsSb:C/GaInP:Se tunnel junction 150, and a 1.0-eV $Ga_{0.70}In_{0.30}As$ bottom junction 160.

A tunable high intensity pulsed solar simulator (T-HIPSS) was used to collect IV curves at variable irradiances. The T-HIPSS uses a long-arc Xe flash bulb in combination with filters and dielectric mirrors to modify the spectrum incident on the devices. The incident spectrum during IV measurement was adjusted to simulate the 2150° C. TPV reference spectrum (hereafter the "TPV spectrum" for short) by matching the ratio of photocurrents between junctions under the simulator spectrum to the ratio of photocurrents under the reference spectrum, as is typical for a multijunction solar PV measurement. In this way, the balance of photocurrents between junctions was correct even though the simulator spectrum is not identical to the reference spectrum, and so the FF is not inflated.

Figure 7:
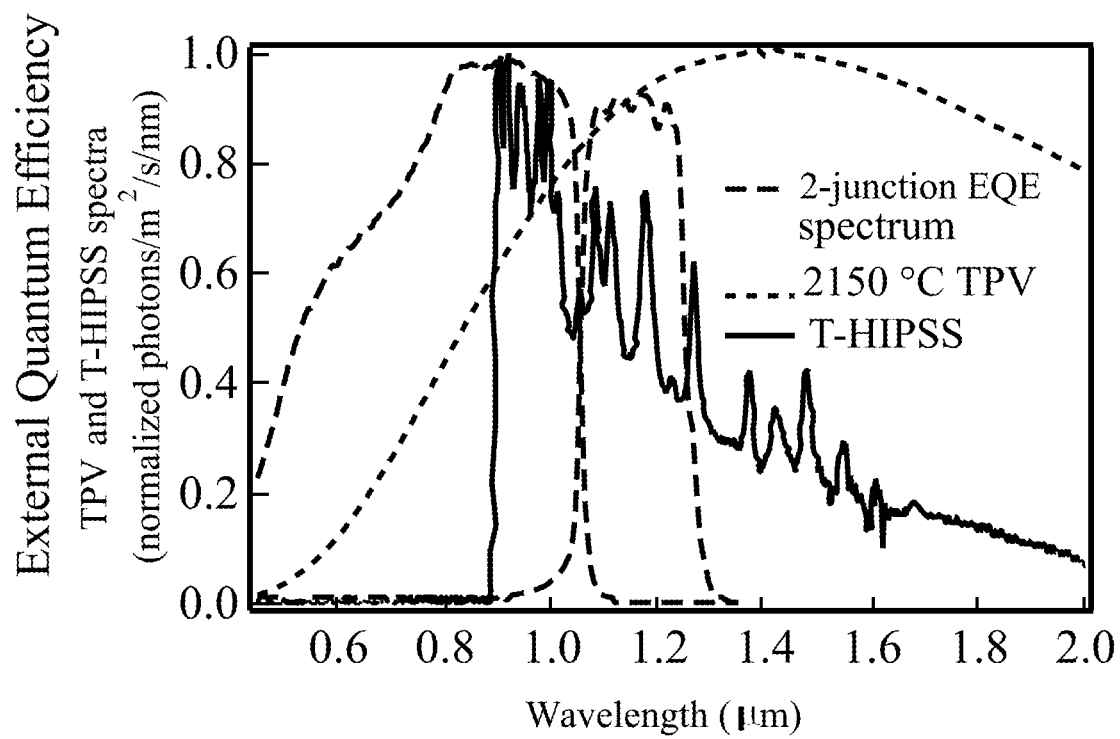
FIG. 7 illustrates a comparison of the 2150° C. TPV spectrum with the T-HIPSS simulator spectrum, normalized to one. The EQE of the tandem device is overlaid, highlighting the portion of the spectrum used by the device, according to some embodiments of the present disclosure.

Compared to the TPV spectrum, the unadjusted spectrum from the Xe flash bulb contained excess short wavelength light. Gross spectral adjustment was accomplished using a double-side polished GaAs substrate with anti-reflection coatings on both sides to remove wavelengths shorter than 880 nm, and minor adjustments were made using dielectric mirrors. The photocurrent ratio, $R_{ij}$, describes the accuracy of the simulated spectrum and was measured using reference cells and spectral mismatch factors. The spectrum was adjusted until $R_{ij}=1.00$, meaning each junction received the correct photocurrent within 1% error. FIG. 7 shows the measured simulator spectrum compared to the reference TPV spectrum. The external quantum efficiency of MS489 after application of an anti-reflection coating is also overlaid.

The irradiance $P_I$ of the TPV reference spectrum is $P_I$=118.2 W/cm².[4] Because the T-HIPSS test spectrum is not identical to the TPV spectrum, the device was used as its own reference cell, in deducing the effective irradiance under the TPV spectrum—for any given IV measurement under the test spectrum—from the $J_{SC}$ of the IV measurement. Integrating the measured EQE in FIG. 7 against the TPV spectrum gives $J_{SC}$=15.5 A/cm$^2$ and 12.9 A/cm$^2$ for the top and bottom junctions respectively, so the $J_{SC}$ for the series-limited two-junction device under the TPV spectrum is $J_{SC,TPV}$=12.9 A/cm$^2$. The fractional effective irradiance $f_E$ at any other intensity is therefore $f_E$=$J_{SC}$/$J_{SC,TPV}$, and the effective irradiance $P_{I,effective}$=$f_E$ $P_I$.

Figure 8:
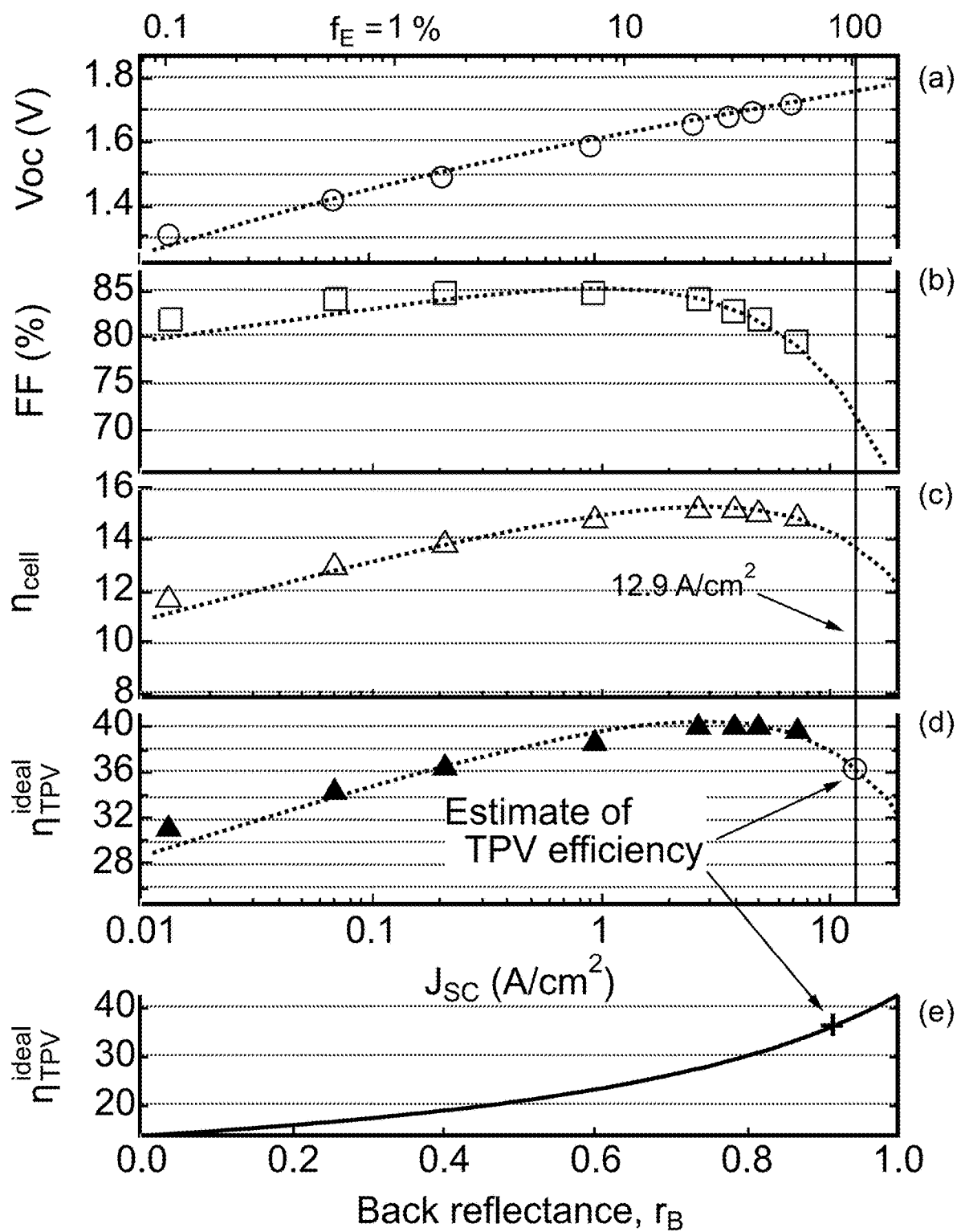
FIG. 8 illustrates an estimate of TPV efficiency. (a-b) VOC and FF as measured on the T-HIPSS, with a fit following a model. (c) Cell efficiency under the TPV spectrum. (d) TPV system efficiency. The vertical line indicates full-irradiance current density of 12.9 mA/cm2. (e) Estimated TPV efficiency for varying back reflectivity. The circle in (d) and the cross in (e) indicate the ~36% TPV efficiency estimate for the cell.

The resulting $V_{OC}$ and fill factor of this device based on T-HIPSS flash measurements are shown as a function of the measured $J_{SC}$ in FIGS. 8A and 8B. The fractional effective irradiance $f_E$ corresponding to $J_{SC}$ is indicated along the top axis. The cell-level efficiency $\eta_{cell}$ is then $$\eta_{cell} = \frac{P_{cell}}{P_{I,effective}} = \frac{V_{OC}J_{SC}FF}{f_E P_I} \quad (1)$$

FIG. 8C shows the resulting values for $\eta$cell, which reaches a maximum of 15.1% efficiency at a current density of 3.86 mA/cm2, corresponding to an effective irradiance level $f_E$=3.86/12.9=29.9% of the TPV spectrum irradiance. Note that the cell efficiency is measured relative to the full wavelength range of the incident spectrum.

The TPV efficiency $\eta_{TPV}$ differs from the cell efficiency in that the portion $P_R$ of the incident power $P_I$ that is reflected back to the radiator is not considered a loss. In the idealized case of unity view factors and no parasitic (e.g. convective) losses, $$\eta_{TPV} = \frac{P_{cell}}{P_I - P_R} = \frac{P_I}{P_I - P_R}\eta_{cell}. \quad (2)$$

This calculation requires broadband measurement of the device reflectance for a wide range of above- and sub-bandgap wavelengths. The wavelengths <1.8 μm were measured during EQE measurement with a calibrated photodiode, while the wavelength range >2.5 μm was measured by normal incidence FTIR microscopy. The FTIR data was modeled using a simple Drude model and extrapolated the model to shorter wavelengths, to fill in the gap between the two measurements. While not as precise as a complete measurement, this procedure is sufficient for the estimates provided in this section.

Integrating the reflectivity of the device (MS489) against the TPV spectrum, a $P_R$=73.5 W/cm$^2$ was determined, from which $\eta_{TPV}$ was calculated as shown in FIG. 8D as a function of $J_{SC}$ on the bottom axis and $f_E$ on the top axis. $\eta_{TPV}$ increases with current density, as expected, peaking at ~39.9% at $f_E$=29.9%. This is a somewhat artificial operating condition since we expect that the TPV cell would be exposed to the full intensity of the emitter spectrum rather than an attenuated spectrum of the same shape. The peak efficiency is not representative of the efficiency under the full TPV irradiance due to series resistance losses, but the T-HIPSS is only capable of accurately reproducing the TPV spectrum up to about 70% of the full irradiance. The dashed lines in FIGS. 8A through 8C show a fit to the T-HIPSS data following ref. 23, and we use the fit to extrapolate an estimated TPV efficiency of $\eta_{TPV}$=36% under the full irradiance of the 2150° C. spectrum. The power loss due to series resistance is significant at this current density, indicating that optimization of this parameter could yield large increases in TPV efficiency. A very simple but reasonable way to estimate the potential efficiency at high current density is to linearly extrapolate the efficiency vs log($J_{SC}$) curve from the lower-$J_{SC}$ region where series resistance is not significant; such extrapolation gives an estimate of $\eta_{TPV}$~43% for this device, even without any other optimizations, if series resistance can be mitigated sufficiently.

In addition, the potential benefits of improving the sub-bandgap reflectance by suitable engineering of the back-side reflector was investigated. It is noted that the device described herein used broad-area electroplated Au back contact that has not been optimized in any way. The incident and reflected irradiances are indicated as $P_I$ and $P_R$ as the sums of their above-bandgap and below-bandgap parts: $P_I$=$P_{I,sub}$+$P_{I,above}$ and $P_R$=$P_{R,sub}$+$P_{R,above}$. The power-weighted sub-bandgap reflectance was defined as $r_b$=$P_{R,sub}$/$P_{I,sub}$. The TPV efficiency $\eta_{TPV}$ can then be rewritten as a function of sub-bandgap reflectance $r_b$, $$\eta_{TPV}(r_b) = \frac{P_I}{P_I - P_R}\eta_{cell} = \frac{P_I}{P_I - P_{R,above} - r_b P_{I,sub}}\eta_{cell} \quad (3)$$

Integrating the above- and below-bandgap parts of the incident and reflected TPV spectrum, we get $P_{I,sub}$=78.3 W/cm$^2$, $P_{R,above}$=1.90 W/cm$^2$, $P_{R,sub}$=71.6 W/cm$^2$, and $r_b$=$P_{R,sub}$/$P_{I,sub}$=0.914=91.4% for our cell. If we think of the sub-bandgap reflectance and thus $r_b$ as quantities that we can vary experimentally with better back reflectors, we can then plot $\eta_{TPV}$ ($r_b$) as shown in FIG. 8E. The cross marks the value of $\eta_{TPV}$=36% corresponding to the measured $r_b$=91.4%. The figure shows that $\eta_{TPV}$ rises rapidly with $r_b$: the same cell but with $r_b$=98%, an optimistic yet realistic target, would have $\eta_{TPV}$~40.8%. Combining this improvement in $r_b$ with the series resistance mitigation described above would yield $\eta_{TPV}$~49%. Finally, optimization of the device $V_{OC}$ and quantum efficiency described earlier is by no means complete; a small improvement of either, combined with the improvements to $r_b$ and series resistance, would lead to $\eta_{TPV}$>50%.

Methods:

The exemplary TPV devices described herein were grown in an inverted fashion by atmospheric-pressure OMVPE with standard precursors. Substrates were Si-doped (100) GaAs offcut 2° towards the (111)B plane. Structures made of step-graded $Ga_{1-x}In_xP$ buffer layers were used to bridge the 2.1% lattice-mismatch between the GaAs substrate and the second metamorphic junction of $Ga_{0.70}In_{0.30}As$. The deposition temperature ($T_D$) for the first depositing of the step-graded buffer layers was 675° C., the growth rate was ~ 7 μm/h, the V/III ratio was 450, and the strain-grading rate was 1%/μm. At the end of the grade a one-μm strain "overshoot" layer was grown, followed by a one-μm "step-back" layer lattice-matched to the in-plane lattice constant of the overshoot. The lattice-matched GaInNAs or lattice-mismatched GaInAs contact layers are described in more detail below. Both the $Al_{0.14}Ga_{0.57}In_{0.29}As$ first metamorphic junction and $Ga_{0.70}In_{0.30}As$ second metamorphic junction were front homojunctions, with a 0.1 μm n-type emitter, 0.1 μm i-layer, and 3 and 2.5 μm thick p-type base layers, respectively. $Ga_{0.32}In_{0.78}P$ cladding layers were used in front and in back of each metamorphic junction. A thin, highly p-doped (>1× 10$^{19}$ cm$^{-3}$), 0.1 μm $Al_{0.40}Ga_{0.31}In_{0.29}As$ layer was deposited after the back GaInP cladding layer. The $Ga_{0.70}In_{0.30}As$ second metamorphic junctions were grown (i.e. fifth depositing) at $T_D$=650° C. with a V/III ratio of 24. The effect of $T_D$ and V/III during the second depositing of the first metamorphic junction was evaluated to determine their effects on the performance of the $Al_{0.14}Ga_{0.57}In_{0.29}As$ first metamorphic cells, and these parameters varied between 650-725° C. and 23-264, respectively. The growth rate (during the third depositing and the fifth depositing) for both junctions was ~6 μm/h. Oxygen concentration [O] was measured in the $Al_{0.14}Ga_{0.57}In_{0.29}As$ first metamorphic junction by secondary ion mass spectrometry. Two-junction $Al_{0.14}Ga_{0.57}In_{0.29}As/Ga_{0.70}In_{0.30}As$ devices with varying metamorphic tunnel junction structures were grown. Tunnel junctions were constructed using a two-layer architecture of either $GaAs_{0.73}Sb_{0.27}$:C/$Ga_{0.70}In_{0.30}As$:Se, $GaAs_{0.73}Sb_{0.27}$:C/$Ga_{0.32}In_{0.78}P$:Se, or $Al_{0.30}Ga_{0.41}In_{0.29}As$:C/$Al_{0.30}Ga_{0.41}In_{0.29}As$:Se, with each of the two layers making up the metamorphic tunnel junction being ~50 nm thick. Se-doping was achieved with hydrogen selenide while carbon tetrachloride was used as a carbon dopant.

In some embodiments of the present disclosure, a metamorphic contact layer may be constructed of GaInAs and/or GaInAsN. In some embodiments of the present disclosure, a GaInAs and/or GaInAsN metamorphic contact layer may be grown at a low temperature (e.g., about 550° C.), which enables the uptake of Se dopant, which can dramatically improve the performance of the metamorphic contact layer. Subsequent to the low temperature deposition of the metamorphic contact layer, a first layer of a first metamorphic junction (GaInP), and the rest of that junction, may be grown at relatively high temperatures (e.g., about 700° C.), which may enable the growth of higher quality materials than might be obtained at lower growth temperatures. Experimental work has shown that if an intermediate GaInAs layer deposited at about 700° C. is NOT provided, significantly more defects may be generated, which can deteriorate the device performance. Therefore, in some embodiments of the present disclosure, a method for producing a device may include a first growth of a GaInAs contact layer at about 550° C. to produce a thickness of about 100 nm, followed by a second growth of a starting layer of GaInAs for the first metamorphic junction at about 700° C. to produce a thickness of about 200 nm. Omitting the 700° C. GaInAs transition layer can lead to poor subsequent epitaxy and device performance.

As described herein, TPV devices were manufactured with electroplated concentrator-style Au/Ni front contacts and a reflective, broad-area electroplated Au back back contacts. Device active areas was about 0.10 cm² and total device areas was about 0.11 cm². A MgF$_2$/ZnS bilayer anti-reflection was applied to a select device by thermal evaporation. External quantum efficiency (EQE) was measured using monochromated light. Above-bandgap reflectance was measured concurrently with EQE using a calibrated photodiode and used to calculate internal quantum efficiency (IQE). Light emitting diodes were used to limit each subcell of multijunction devices enabling measurement of individual subcell QE. EQE was used along with a reference cell to calibrate a Xe-arc lamp source to a one-sun AM1.5D condition under which current density-voltage (J-V) curves were measured. J-V curves were also measured in the dark. It was noticed that the AM1.5D spectrum can overdrive the first metamorphic junction of a tandem relative to the TPV spectrum, and, in this example, was ~1000× lower in total irradiance, but provided a convenient benchmark for single-junction cell development. Contact resistances were measured from diagnostic structures by the transfer length method. Electroluminescence external radiative efficiency was measured on select devices as a function of current-density and converted to J-V via the reciprocity theorem. Flash J-V measurements were conducted under an uncorrected spectrum using a high-intensity pulsed solar simulator (HIPSS) with a Xe-arc lamp to characterize tunnel junction performance at high current-density. Flash J-V measurements were also performed under a hypothetical TPV spectrum represented by the emission of a 2150° C. radiator[4] using a tunable high-intensity pulsed solar simulator (T-HIPSS), described in section III.D. Estimation of a TPV system efficiency required knowledge of the broadband device reflectance. Reflectance at wavelengths <1.8 μm was collected during EQE measurement, while reflectance >2.5 μm was measured by normal incidence Fourier transform infrared (FTIR) microscopy. The spot size for this measurement was adjustable between 10 and 300 μm, enabling direct measurement of the processed tandem device between the grid fingers. The FTIR was calibrated using a high-reflectivity gold standard. Reflectivity from 1.8-2.5 μm was estimated using using a Drude model for free-carrier absorption.

EXAMPLES

Example 1. A method comprising: manufacturing a device, wherein the device comprises, in order: a metamorphic contact layer; a first (top, high bandgap) metamorphic junction; a metamorphic tunnel junction; and a second (bottom, low bandgap) metamorphic junction, wherein: the manufacturing comprises, in order: a first depositing of a buffer layer onto a substrate; a second depositing of the metamorphic contact layer; a third depositing of the first metamorphic junction; a fourth depositing of the metamorphic tunnel junction; a fifth depositing of the second metamorphic junction; and removing the buffer layer and the substrate.

Example 2. The method of Example 1, wherein the buffer layer comprises a continuous graded buffer layer or a plurality of step-graded buffer layers.

Example 3. The method of either Example 1 or Example 2, further comprising, between the first depositing and the second depositing, the depositing of a sacrificial layer capable of degradation in the presence of a chemical etchant.

Example 4. The method of any one of Examples 1-3, wherein the sacrificial layer comprises AlInP.

Example 5. The method of any one of Examples 1-4, wherein the removing comprises applying the chemical etchant to the sacrificial layer.

Example 6. The method of any one of Examples 1-5, wherein the chemical etchant comprises an acid.

Example 7. The method of any one of Examples 1-6, wherein the acid comprises hydrochloric acid.

Example 8. The method of any one of Examples 1-7, further comprising a first intermediate depositing of a strain overshoot layer having a 1 μm thickness, performed after the first depositing and before the second depositing.

Example 9. The method of any one of Examples 1-8, further comprising a second intermediate depositing of a step-back layer lattice-matched to the in-plane lattice constant of the overshoot layer and having a 1 μm thickness, performed after the first intermediate depositing and before the second depositing.

Example 10. The method of any one of Examples 1-9, wherein the strain "overshoot" layer comprises $Ga_{(1-z)}In_zP$ and $0.5 \leq z \leq 0.8$.

Example 11. The method of any one of Examples 1-10, wherein the step-back layer comprises an alloy comprising at least one two of gallium, indium, aluminum, arsenic, antimony, nitrogen, or phosphorous.

Example 12. The method of any one of Examples 1-11, wherein the metamorphic contact layer comprises at least three of gallium, indium, aluminum, arsenic, or phosphorous.

Example 13. The method of any one of Examples 1-12, wherein the metamorphic contact layer comprises $Ga_{(1-x)}In_xAs$ and $0.6 \leq x \leq 0.8$.

Example 14. The method of any one of Examples 1-13, wherein the metamorphic contact layer comprises about $Ga_{0.31}In_{0.69}As$.

Example 15. The method of any one of Examples 1-14, wherein the metamorphic contact layer further comprises nitrogen.

Example 16. The method of any one of Examples 1-15, wherein the metamorphic contact layer is doped with selenium.

Example 17. The method of any one of Examples 1-16, wherein the metamorphic contact layer has a thickness between about 0.05 μm and about 0.50 μm.

Example 18. The method of any one of Examples 1-17, wherein: the second depositing comprises: a first growing step; and a second growing step, wherein: the first growing step is performed at a temperature between about 400° C. and about 800° C., and the second growing step is performed at a temperature between about 600° C. and about 800° C.

Example 19. The method of any one of Examples 1-18, wherein the first growing produces a highly-Se-doped first layer having between about 1e18 and about 1e20 Se atoms per cubic centimeter and a thickness between about 0.1 μm and about 1.0 μm and the Se is provided by an $H_2Se$ gas.

Example 20. The method of any one of Examples 1-19, wherein the second growing produces a lower-Se-doped second layer having between about 1e17 and about 1e19 Se atoms per cubic centimeter and a thickness between greater than zero μm and about 1.0 μm and the Se is provided by an $H_2Se$ gas.

Example 21. The method of any one of Examples 1-20, wherein the first metamorphic junction comprises AlGaInAs.

Example 22. The method of any one of Examples 1-21, wherein the first metamorphic junction comprises $Al_{0.14}Ga_{0.57}In_{0.29}As$.

Example 23. The method of any one of Examples 1-22, wherein the first metamorphic junction comprises at least one of a zinc dopant or a selenium dopant at a concentration between about $2.1 \times 10^{16}$ mol/cm3 and about $1.0 \times 10^{17}$ mol/cm3.

Example 24. The method of any one of Examples 1-23, wherein the third depositing is completed at a temperature between about 500° C. and about 800° C.

Example 25. The method of any one of Examples 1-24, wherein the temperature is selected to reduce the oxygen present during the third depositing to a concentration less than 1e16 atoms/cm$^3$.

Example 26. The method of any one of Examples 1-25, wherein the third depositing is completed at a V/III ratio between about 1:1 and about 1000:1.

Example 27. The method of any one of Examples 1-26, wherein the metamorphic tunnel junction comprises an alloy comprising at least one of GaAsSb:C, GaInAs:Se, GaInP:Se, AlGaInAs:C, AlGaInAs:Se, AlInAs:C, AlInAs:Se, AlInAs:Zn, AlGaInAs:Zn, GaInP:Zn, GaInP:C, or AlGaAsSb:C.

Example 28. The method of any one of Examples 1-27, wherein the metamorphic tunnel junction comprises a first layer and a second layer, each having a thickness between about 10 nm and about 200 nm.

Example 29. The method of any one of Examples 1-28, wherein the first layer comprises $GaAs_{0.73}Sb_{0.27}$:C and the second layer comprises $Ga_{0.70}In_{0.30}As$:Se and at least one of the Se dopant or the carbon dopant is present at a concentration between about 1e18 atoms/cm$^3$ and about 1e20 atoms/cm$^3$.

Example 30. The method of any one of Examples 1-29, wherein the first layer comprises $GaAs_{0.73}Sb_{0.27}$:C and the second layer comprises $Ga_{0.32}In_{0.78}P$:Se and at least one of Se dopant or the carbon dopant is present at a concentration between about 1e18 atoms/cm$^3$ and about 1e20 atoms/cm$^3$.

Example 31. The method of any one of Examples 1-30, wherein the first layer comprises $Al_{0.30}Ga_{0.41}In_{0.29}As$:C and the second layer comprises $Al_{0.30}Ga_{0.41}In_{0.29}As$:Se and at least one of the Se dopant or the carbon dopant is present at a concentration between about 1e18 atoms/cm$^3$ and about 1e20 atoms/cm$^3$.

Example 32. The method of any one of Examples 1-31, wherein the second metamorphic junction comprises GaInAs.

Example 33. The method of any one of Examples 1-32, wherein the second metamorphic junction comprises $Ga_{0.70}In_{0.30}As$.

Example 34. The method of any one of Examples 1-33, wherein the fifth depositing is completed at a temperature between about 500° C. and about 800° C.

Example 35. The method of any one of Examples 1-34, wherein the fifth depositing is completed at a V/III ratio between about 1:1 and about 1000:1.

Example 36. The method of any one of Examples 1-35, wherein the first depositing is performed at a temperature between about 500° C. and about 800° C.

Example 37. The method of any one of Examples 1-36, wherein the first depositing is performed at a growth rate between about 0.1 μm/hr and about 50 μm/hr.

Example 38. The method of any one of Examples 1-37, wherein the first depositing is performed at a strain-grading rate between about 0.1% and about 4.0%.

Example 39. The method of any one of Examples 1-38, wherein the first depositing is performed at a V/III ratio between about 1:1 and about 1000:1.

Example 40. The method of any one of Examples 1-39, wherein the substrate comprises GaAs or InP.

Example 41. The method of any one of Examples 1-40, wherein the substrate further comprises germanium.

Example 42. The method of any one of Examples 1-41, wherein the substrate has an offcut towards the (111)B plane of the substrate.

Example 43. The method of any one of Examples 1-42, wherein the manufacturing is performed using organometallic vapor phase epitaxy (OMVPE).

Example 44. The method of any one of Examples 1-43, wherein the manufacturing is performed at a pressure between about 0.1 atm and about 5 atm.

Example 45. The method of any one of Examples 1-44, further comprising, after the fifth depositing, a sixth depositing of a second metamorphic contact layer onto the second metamorphic junction.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method for manufacturing a metamorphic thermophotovoltaic device, the method comprising:
 a first depositing of a buffer layer onto a substrate;
 a second depositing of a first contact layer;
 a third depositing of a first junction;
 a fourth depositing of a tunnel junction;
 a fifth depositing of a second junction;
 and removing the buffer layer and the substrate, wherein the metamorphic thermophotovoltaic device comprises, after the removing:
 the first contact layer;
 the first junction;
 the tunnel junction;
 and the second junction, wherein:
 the second depositing comprises:
  a first growing step performed at a temperature between about 500° C. and about 600° C., resulting in a first layer;
  and a second growing step performed at a temperature between about 650° C. and about 750° C. resulting in a second layer;
 the first junction comprises a first III-V composition,
 the second junction comprises a second III-V composition,
 each of the first contact layer, the first junction, the tunnel junction, and the second junction are substantially lattice-matched,
 each of the first layer and the second layer of the first contact layer comprises $Ga_{(1-x)}InAs$ where $0.2<x<0.4$, and the first layer has a selenium concentration between about $1\times10^{18}$ and about $1\times10^{20}$ Se atoms per cubic centimeter.

2. The method of claim 1, wherein the buffer layer comprises a continuous graded buffer layer or a plurality of step-graded buffer layers.

3. The method of claim 1, further comprising, between the first depositing and the second depositing, the depositing of a sacrificial layer capable of degradation in the presence of a chemical etchant.

4. The method of claim 3, wherein the sacrificial layer comprises AlInP.

5. The method of claim 3, wherein the removing of the buffer layer and the substrate comprises applying the chemical etchant to the sacrificial layer.

6. The method of claim 5, wherein the chemical etchant comprises an acid.

7. The method of claim 6, wherein the acid comprises hydrochloric acid.

8. The method of claim 1, further comprising a first intermediate depositing of a strain overshoot layer having a thickness of about 1 µm, performed after the first depositing and before the second depositing.

9. The method of claim 8, further comprising a second intermediate depositing of a step-back layer lattice-matched to the in-plane lattice constant of the overshoot layer and having a thickness of about 1 µm, performed after the first intermediate depositing and before the second depositing.

10. The method of claim 8, wherein the strain overshoot layer comprises $Ga_{(1-z)}In_zP$ and $0.5 \leq z \leq 0.8$.

11. The method of claim 9, wherein the step-back layer comprises an alloy comprising at least one two of gallium, indium, aluminum, arsenic, antimony, nitrogen, or phosphorous.

12. The method of claim 1, wherein each of the first layer and the second layer of the first contact layer comprises about $Ga_{0.70}In_{0.30}As$.

13. The method of claim 12, wherein each of the first layer and the second layer of the first contact layer further comprises nitrogen.

14. The method of claim 1, wherein:
 the first layer of the first contact layer has a thickness between about 0.1 µm and about 1.0 µm, and
 the second layer of the first contact layer has a thickness between greater than zero µm and about 1.0 µm.

15. The method of claim 1, wherein the second layer has a selenium concentration between about $1\times10^{17}$ and about $1\times10^{19}$ Se atoms per cubic centimeter.

16. The method of claim 15, wherein the Se for the first layer and the second layer of the first contact layer is provided by an $H_2Se$ gas.

17. The method of claim 1, wherein the tunnel junction comprises at least three of aluminum, gallium, indium, arsenic, phosphorous, or antimony.

18. The method of claim 17, wherein:
 the tunnel junction comprises a first layer and a second layer,
 the first layer comprises gallium, arsenic, and antimony, and
 the second layer comprises gallium and indium and at least one of arsenic or phosphorous.

19. The method of claim 1, further comprising:
 after the fifth depositing, a sixth depositing of a second contact layer, wherein:
 the second contact layer and the second junction are substantially lattice-matched.

* * * * *